US012684794B2

(12) United States Patent
Tsuji et al.

(10) Patent No.: US 12,684,794 B2
(45) Date of Patent: Jul. 14, 2026

(54) SEMICONDUCTOR APPARATUS, AND MANUFACTURING METHOD THEREOF

(71) Applicant: FUJI ELECTRIC CO., LTD.,
Kanagawa (JP)

(72) Inventors: Hidenori Tsuji, Higashimurayama-city
(JP); Katsunori Ueno, Matsumoto-city
(JP); Shinya Takashima, Hachioji-city
(JP); Takashi Yoshimura,
Matsumoto-city (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 266 days.

(21) Appl. No.: 18/337,032

(22) Filed: Jun. 18, 2023

(65) Prior Publication Data

US 2024/0030322 A1      Jan. 25, 2024

(30) Foreign Application Priority Data

Jul. 22, 2022     (JP) ................................. 2022-117075

(51) Int. Cl.
*H10D 12/00* (2025.01)
*H01L 21/265* (2006.01)
*H10D 12/01* (2025.01)
*H10D 62/60* (2025.01)

(52) U.S. Cl.
CPC ......... *H10D 12/481* (2025.01); *H01L 21/265*
(2013.01); *H10D 12/038* (2025.01); *H10D*
*62/60* (2025.01)

(58) Field of Classification Search
CPC .... H10D 12/481; H10D 12/038; H10D 62/60;
H10D 62/124; H10D 62/834; H01L
21/265; H01L 21/26506
See application file for complete search history.

(56) References Cited

U.S. PATENT DOCUMENTS

2007/0278514 A1    12/2007  Schulze
2016/0141399 A1*    5/2016  Jelinek ..................... H01L 22/12
                                                     438/7
2018/0019131 A1     1/2018  Suzuki
2018/0122895 A1     5/2018  Jelinek
(Continued)

FOREIGN PATENT DOCUMENTS

JP          2016096338 A        5/2016
JP          2018078216 A        5/2018
(Continued)

*Primary Examiner* — Syed I Gheyas

(57)          ABSTRACT

A manufacturing method of a semiconductor apparatus
including: setting, depending on a distribution of the carrier
concentrations that the buffer region should have, a dose
amount of hydrogen ions to be implanted into a plurality of
depth positions corresponding to the plurality of concentra-
tion peaks; and implanting, depending on the dose amount
that is set in the setting, the hydrogen ions into the semi-
conductor substrate is provided. In the setting, among the
plurality of concentration peaks, the dose amount of the
hydrogen ions for a deepest peak farthest from the lower
surface of the semiconductor substrate is set depending on a
carbon concentration of the semiconductor substrate, and the
dose amount for at least one of the concentration peaks other
than the deepest peak is set regardless of the carbon con-
centration of the semiconductor substrate.

17 Claims, 12 Drawing Sheets

DEPTH POSITION FROM LOWER SURFACE (μm)

(56) References Cited

U.S. PATENT DOCUMENTS

| | | | |
|---|---|---|---|
| 2018/0130875 A1 | 5/2018 | Suzuki | |
| 2018/0182844 A1 | 6/2018 | Nakamura | |
| 2018/0366566 A1 | 12/2018 | Suzuki | |
| 2020/0058506 A1 | 2/2020 | Nakamura | |
| 2021/0043739 A1* | 2/2021 | Kato | H10D 12/481 |
| 2021/0050215 A1* | 2/2021 | Agata | H10D 12/481 |
| 2022/0059681 A1 | 2/2022 | Suzuki | |
| 2022/0084828 A1* | 3/2022 | Yoshida | H10D 12/481 |
| 2022/0115522 A1 | 4/2022 | Otsuka | |
| 2022/0262638 A1* | 8/2022 | Nakamura | H10D 8/00 |
| 2023/0387218 A1* | 11/2023 | Hoshi | H10D 12/481 |

FOREIGN PATENT DOCUMENTS

| | | | |
|---|---|---|---|
| JP | 2018107303 A | 7/2018 | |
| JP | 2019009148 A | 1/2019 | |
| JP | 2020027921 A | 2/2020 | |
| JP | 2020107917 A | 7/2020 | |
| JP | 2020182009 A | 11/2020 | |
| JP | 2022035046 A | 3/2022 | |
| JP | 2022062443 A | 4/2022 | |
| WO | 2016147264 A1 | 9/2016 | |
| WO | 2021125064 A1 | 6/2021 | |

* cited by examiner

100

SEMICONDUCTOR APPARATUS, AND MANUFACTURING METHOD THEREOF

The contents of the following Japanese patent application(s) are incorporated herein by reference:
NO. 2022-117075 filed in JP on Jul. 22, 2022

BACKGROUND

1. Technical Field

The present invention relates to a semiconductor apparatus and a manufacturing method of the semiconductor apparatus.

2. Related Art

Conventionally known is a technique for implanting a hydrogen ion into a semiconductor substrate, and thereby forming a donor derived from the hydrogen ion (for example, refer to Patent Document 1 or 2).

Patent Document 1: Japanese Patent Application Publication No. 2016-96338
Patent Document 2: U.S. Patent 2018/0122895

DESCRIPTION OF EXEMPLARY EMBODIMENTS

Figure 1:
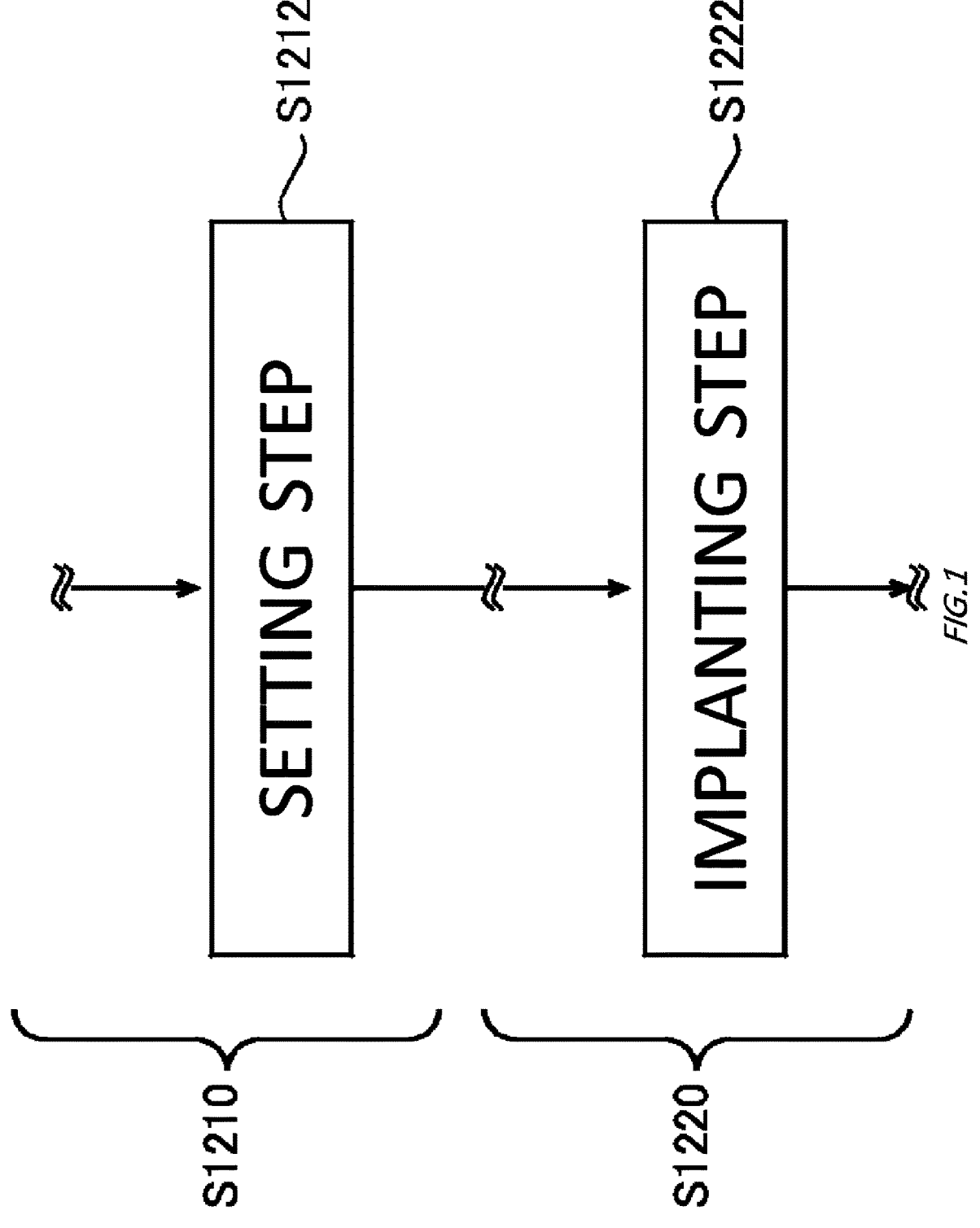
FIG. 1 is a diagram for explaining one example of a manufacturing method of a semiconductor apparatus according to one embodiment of the present invention.

Hereinafter, the present invention will be described through embodiments of the invention, but the following embodiments do not limit the invention according to claims.

In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor apparatus is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing these signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

A phrase, an "upper surface side" may refer to a region from a center of the semiconductor substrate in the depth direction to the upper surface of the semiconductor substrate. Similarly, a region from the center of the semiconductor substrate in the depth direction to the lower surface of the semiconductor substrate may be referred to as a "lower surface side".

In the present specification, a case where a term such as "same" or "equal" is mentioned may include a case where an error that occurs due to a variation in manufacturing or the like is included. This error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate, and thereby providing a semiconductor having a conductivity type of the N type, or a semiconductor having conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D - N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. A Si—H interstitial defect which is a combination of interstitial silicon (Si-i) and hydrogen in a silicon semiconductor, and a CiOi-H defect which is a combination of interstitial carbon and interstitial oxygen and hydrogen also function as donors that supply electrons. In the present specification, a hydrogen donor may refer to the VOH defect, the Si—H interstitial defect, or the CiOi-H defect.

In the semiconductor substrate of the present specification, bulk donors of the N type are distributed throughout. The bulk donor is a dopant donor substantially uniformly contained in an ingot during the manufacturing of the ingot from which the semiconductor substrate is made. The bulk donor of this example is an element other than hydrogen. A bulk donor dopant is, for example, phosphorus, antimony, arsenic, selenium, or sulfur, but the invention is not limited to this. The bulk donor of this example is phosphorus. The bulk donor is also contained in a P type region. The semiconductor substrate may be a wafer cut out from a semiconductor ingot, or may be a chip obtained by singulating the wafer. The semiconductor ingot may be manufactured by any of a Czochralski method (CZ method), a magnetic-field applied Czochralski method (MCZ method), or a float zone method (FZ method). The ingot in this example is manufactured by the MCZ method. An oxygen concentration contained in the substrate manufactured by the MCZ method is $1\times10^{17}$ to $7\times10^{17}$/cm³. The oxygen concentration contained in the substrate manufactured by the FZ method is $1\times10^{15}$ to $5\times10^{16}$/cm³. When the oxygen concentration is high, hydrogen donors tend to be easily generated. The bulk donor concentration may use a chemical concentration of bulk donors distributed throughout the semiconductor substrate, or may be a value between 90% and 100% of this chemical concentration. As the semiconductor substrate, a non-doped substrate containing no dopant being phosphorus etc. may be used. In that case, the bulk donor concentration (DO) of the non-doped substrate is, for example, from $1\times10^{10}$/cm³ to $5\times10^{12}$/cm³. The bulk donor concentration (DO) of the non-doped substrate is preferably $1\times10^{10}$/cm³ or more. The bulk donor concentration (DO) of the non-doped substrate is preferably $5\times10^{12}$/cm³ or less. Each concentration in the present invention may be a value at room temperature. For the value at room temperature, a value at 300 K (Kelvin) (about 26.9 degrees Celsius) may be used as an example.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type. In the specification, a unit system is the SI base unit system unless otherwise particularly noted. Although a unit of length may be expressed using cm, it may be converted to meters (m) before calculations.

A chemical concentration in the present specification indicates an atomic density of an impurity measured regardless of an electrical activation state. The chemical concentration can be measured by, for example, secondary ion mass spectrometry (SIMS). The net doping concentration described above can be measured by capacitance-voltage profiling (CV profiling). The net doping concentration measured by the capacitance-voltage profiling (CV profiling) may be used as a carrier concentration. Further, a carrier concentration measured by spreading resistance profiling (SRP method) may be used as the net doping concentration. A carrier means an electron charge carrier or a hole charge carrier. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

When a concentration distribution of the donors, acceptors, or net doping has a peak in a region, a value of this peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, atoms/cm³ or /cm³ is used to indicate a concentration per unit volume. This unit is used for a concentration of donors or acceptors in a semiconductor substrate, or a chemical concentration. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like. The carrier concentration becomes lower for the following reason. In the SRP method, a spreading resistance is measured, and a carrier concentration is converted from a measurement value of the spreading resistance. At this time, mobility of the crystalline state is used as the carrier mobility. Meanwhile, despite the fact that carrier mobility is reduced at a position where the lattice defect is introduced, the carrier concentration is calculated by using the carrier mobility of the crystalline state. Therefore, a value lower than an actual carrier concentration, i.e., a concentration of donors or acceptors, is obtained.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 is a diagram for explaining one example of a manufacturing method of a semiconductor apparatus according to one embodiment of the present invention. The semiconductor apparatus has a semiconductor device formed on a semiconductor substrate. The semiconductor substrate is a silicon substrate formed by using the MCZ method, for example, but not limited to this. For example, the semiconductor device is an Insulated Gate Bipolar Transistor (IGBT), a diode, or a power semiconductor device such as a Reverse Conducting (RC)-IGBT, but not limited to this.

The manufacturing method of this example includes designing step S1210, and manufacturing step S1220. In the designing step S1210, structure of the semiconductor apparatus is designed based on a characteristic, such as a breakdown voltage, that the semiconductor apparatus should have. In the designing step S1210, at least one of a position, size, carrier concentration of each component of the semiconductor apparatus, or a dose amount etc. of dopant ions that should be implanted into each position of the semiconductor substrate is decided. In the manufacturing step S1220, the each component of the semiconductor apparatus is manufactured based on the structure designed in the designing step S1210. The manufacturing step S1220 includes at least one of processes of dopant ion implantation, heat treatment, exposure, etching, film deposition etc.

The semiconductor apparatus of this example includes a N− type drift region and a N+ type buffer region provided in the semiconductor substrate. The buffer region is provided between the drift region and a lower surface of the semiconductor substrate. The buffer region includes a plurality of concentration peaks of which carrier concentrations are higher than that of the drift region. For example, the buffer region is a field stopper layer in an IGBT, but not limited to this. An example of the structure of the semiconductor apparatus will be described below.

The designing step S1210 of this example has setting step S1212. The manufacturing step S1220 of this example has implanting step S1222. In setting step S1212, a dose amount of hydrogen ions to be implanted into the buffer region is set depending on a distribution of carrier concentrations that the buffer region should have. The distribution of the carrier concentrations is decided depending on a breakdown voltage that the semiconductor apparatus should have, for example. Because the buffer region of this example has the plurality of concentration peaks, in setting step S1212, each dose amount of hydrogen ions to be implanted into a plurality of depth positions corresponding to the plurality of concentration peaks is set. In implanting step S1222, hydrogen ions are implanted into each depth position in the semiconductor substrate depending on the each dose amount set in setting step S1212.

Implanting the hydrogen ions into the semiconductor substrate forms hydrogen donors derived from the hydrogen ion implantation. A hydrogen donor is formed by a hydrogen atom being attached to an oxygen atom in the semiconductor substrate, for example. The hydrogen donor is the above described VOH defect, Si—H interstitial defect, or CiOi-H defect, for example. A concentration at which the hydrogen donor is formed may change depending on a carbon concentration or an oxygen concentration contained in the semiconductor substrate. A semiconductor substrate formed by using the MCZ method contains a high concentration of carbon or oxygen, and has relatively large variations in carbon concentrations or oxygen concentrations. For example, a carbon concentration in the semiconductor substrate that is formed by using the MCZ method may have a variation range of from $0.01 \times 10^{16}/cm^3$ to $1 \times 10^{16}/cm^3$. Similarly, the oxygen concentrations in the semiconductor substrate formed by the MCZ method may have a variation range of from $0.01 \times 10^{18}/cm^3$ to $1 \times 10^{18}/cm^3$, for example.

Since a concentration of hydrogen donors changes depending on the carbon concentration or oxygen concentration of the semiconductor substrate, it is preferable to adjust the dose amount of the hydrogen ions to be implanted into the buffer region depending on the carbon concentration or oxygen concentration of the semiconductor substrate. However, adjusting each of multiple dose amounts for the plurality of depth positions requires changing a condition of hydrogen ion implantation process for each depth position, for every carbon concentration of the semiconductor substrate. Therefore, manufacturing processes become complicated. This may also cause an increase in manufacturing cost of the semiconductor apparatus.

Figure 2:
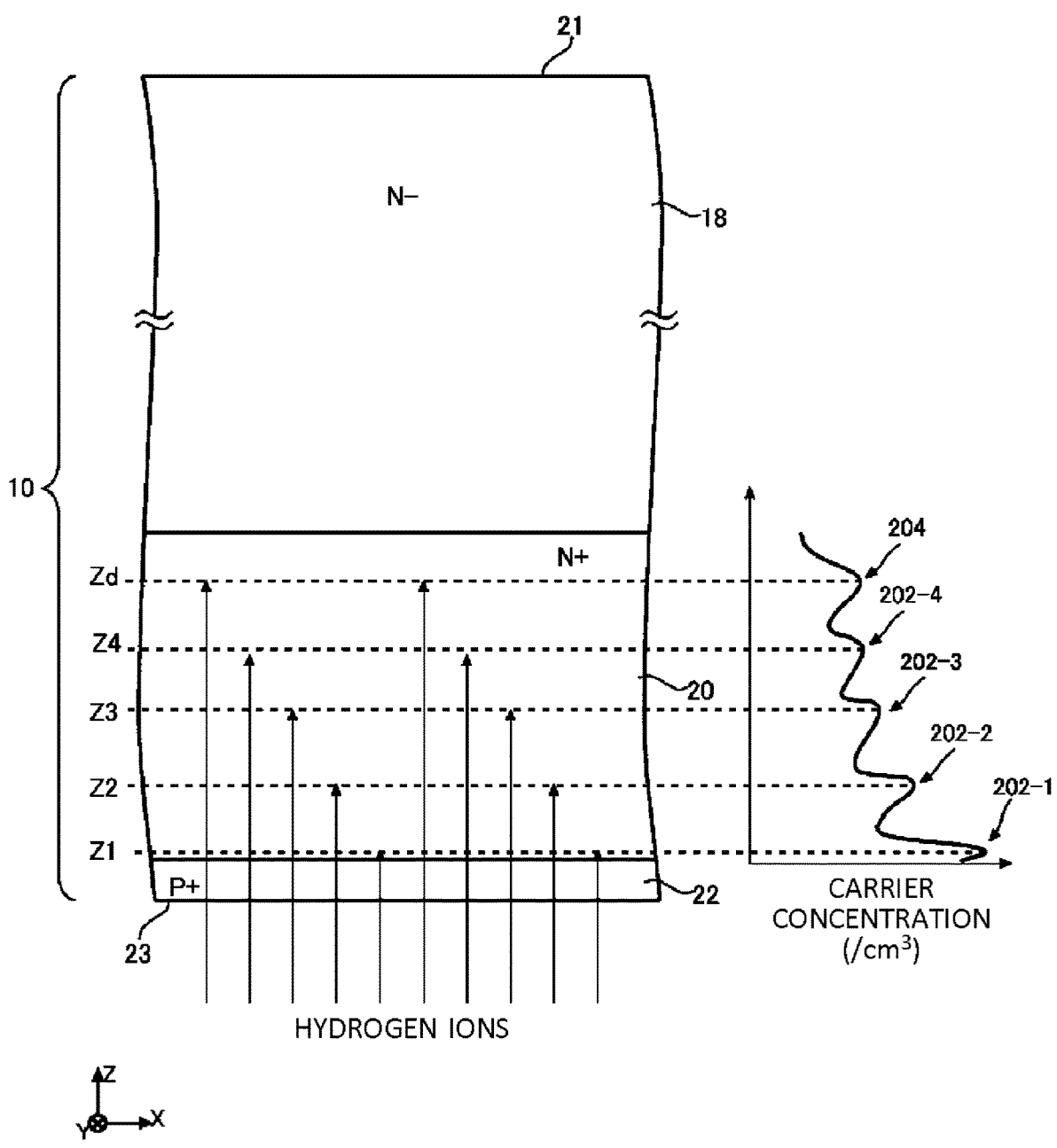
FIG. 2 is a diagram for explaining one example of setting step S1212.

FIG. 2 is a diagram for explaining examples of setting step S1212 and implanting step S1222. FIG. 2 shows a part of a cross section of the semiconductor substrate 10. Also, next to the cross section of the semiconductor substrate 10, one example of a carrier concentration distribution that a completed semiconductor apparatus should have is illustrated. The semiconductor substrate 10 may be a disk-shaped wafer, or may also be an individual chip formed by dicing a wafer. The semiconductor substrate 10 has an upper surface 21 and a lower surface 23. In the present specification, a X axis and a Y axis are two orthogonal axes parallel to the upper surface 21, and a Z axis is perpendicular to the upper surface 21. In the present specification, a depth direction may refer to a direction parallel to the Z axis. Further, a depth position may refer to a position on the Z axis. Unless specifically described, the depth position refers to a distance from the lower surface 23 on the Z axis.

In the semiconductor substrate 10, a N− type drift region 18 and a N+ type buffer region 20 are provided. A doping concentration of the drift region 18 may be the same as a bulk doping concentration, or may also be higher than the bulk doping concentration. A buffer region 20 is arranged between the drift region 18 and the lower surface 23. A length of the buffer region 20 in the depth direction may be shorter or longer than half a thickness of the semiconductor substrate 10 in the depth direction.

A region corresponding to a semiconductor device to be formed on the semiconductor apparatus may be provided between the buffer region 20 and the lower surface 23. In this example, a P+ type collector region 22 is provided between the buffer region 20 and the lower surface 23. An IGBT is formed on the semiconductor substrate 10 of this example. In another example, a N+ type cathode region may be provided between the buffer region 20 and the lower surface 23. In that case, a diode is formed on the semiconductor substrate 10. Also, there is formed structure corresponding to the semiconductor device to be formed on the semiconductor apparatus between the drift region 18 and the upper surface 21, but it is omitted in the illustration of FIG. 2.

The buffer region 20 includes a plurality of concentration peaks of which carrier concentrations are higher than that of the drift region 18. In the example illustrated in FIG. 2, the buffer region 20 has, in an increasing order of distance from the lower surface 23, a concentration peak 202-1, a concentration peak 202-2, a concentration peak 202-3, a concentration peak 202-4, and the deepest peak 204. The deepest peak 204 is a concentration peak arranged farthest from the lower surface 23 among the plurality of concentration peaks of the buffer region 20. In the present specification, a concentration peak refers to a mountain-shaped portion in a concentration distribution. A concentration at a local maximum of a concentration peak (i.e., a local maximum value) may be used as a concentration of this concentration peak.

The distribution of the carrier concentrations in the buffer region 20 is designed depending on a characteristic, such as a breakdown voltage, that the semiconductor apparatus should have. A number of the concentration peaks of a buffer region 20 may be two or more, three or more, or four or more. The number of the concentration peaks of the buffer region 20 may be ten or less, five or less, or four or less. In the example illustrated in FIG. 2, a number of concentration peaks of the buffer region 20 is five.

In implanting step S1222, a hydrogen ion (for example, proton) is implanted at each depth position where the concentration peak 202 and deepest peak 204 should be formed. The hydrogen ion may be implanted from the lower surface 23. A depth position where the hydrogen ion is implanted can be adjusted with acceleration energy (for example, acceleration voltage) for accelerating the hydrogen ion. For example, the acceleration energy of hydrogen ions is adjusted so that average projected ranges of the hydrogen ions become positions Z1, Z2, Z3, Z4, and Zd, each being local maximum position of a concentration peak.

A dose amount of hydrogen ions for the each depth position is determined depending on a concentration of a local maximum of a concentration peak that should be formed. In the semiconductor substrate 10, hydrogen donors having a concentration corresponding to a dose amount of the implanted hydrogen ions are formed. Note that, as described above, the concentration of the hydrogen donors to be formed changes depending on the carbon concentration or oxygen concentration of the semiconductor substrate 10.

In setting step S1212 of this example, among the plurality of concentration peaks of the buffer region 20, a dose amount of hydrogen ions for the deepest peak 204 is set depending on the carbon concentration or oxygen concentration of the semiconductor substrate 10. Used as the carbon concentration or oxygen concentration of the semiconductor substrate 10 may be a value at the depth position Zd of the deepest peak 204, an average value over the entire buffer region 20, or an average value over the entire semiconductor substrate 10. In addition, in setting step S1212, among the concentration peaks of the buffer region 20, a dose amount for at least one of the concentration peaks 202 other than the deepest peak 204 is set regardless of the carbon concentration or oxygen concentration of the semiconductor substrate 10. In setting step S1212, dose amounts for two or more concentration peaks 202 may be set regardless of the carbon concentration or oxygen concentration of the semiconductor substrate 10, or dose amounts for all of the concentration peaks 202 may be set regardless of the carbon concentration or oxygen concentration of the semiconductor substrate 10. The dose amount of the hydrogen ions for the deepest peak 204 may be set depending on the carbon concentration, the oxygen concentration, or both of the carbon concentration and oxygen concentration of the semiconductor substrate 10.

In setting step S1212, a set dose amount corresponding to a carrier concentration distribution may be decided, assuming that the carbon concentration of the semiconductor substrate 10 is being a predetermined reference concentration. Then, a set dose amount for the deepest peak 204 may be adjusted, depending on how much an actual carbon concentration or oxygen concentration of the semiconductor substrate 10 deviates from the reference concentration. The higher the actual carbon concentration or oxygen concentration of the semiconductor substrate 10 is, the easier a hydrogen donor is to be formed. In setting step S1212, the higher the actual carbon concentration or oxygen concentration of the semiconductor substrate 10 is, the lower the set dose amount for the deepest peak 204 may be adjusted. In setting step S1212, a set dose amount for at least one concentration peak 202 may be maintained without being adjusted depending on the carbon concentration or oxygen concentration. In setting step S1212, set dose amounts of two or more concentration peaks 202 may be maintained, or set dose amounts of all of the concentration peaks 202 may be maintained.

In setting step S1212, the dose amount of the hydrogen ions for the deepest peak 204 may be adjusted so that an integral value of a carrier concentration in the buffer region 20 to be actually formed approaches a designed value defined by a designed carrier concentration distribution. In setting step S1212, the dose amount of the hydrogen ions for the deepest peak 204 may be adjusted so that a difference between this integral value and the designed value becomes within a predetermined allowable range. This allowable range may be ±10%, ±5%, or ±2% of the designed value. Information representing how much this integral value changes when the dose amount for the deepest peak 204 is changed may be experimentally obtained in advance, or obtained through a simulation by using a computer.

According to this example, since the set dose amount for the at least one concentration peak 202 is unchanged depending on the carbon concentration or oxygen concentration, setting step S1212 and implanting step S1222 can be simplified. This also enables suppressing an increase in the manufacturing cost of the semiconductor apparatus.

Hydrogen donors are formed not only in the vicinity of a projected range of hydrogen ions, but also in a passed-through region where the hydrogen ions have passed. For example, if hydrogen ions are implanted in the depth position Zd, a passed-through region of the hydrogen ions is from the lower surface 23 to the depth position Zd. Hydrogen donors corresponding to a dose amount of the hydrogen ions are also formed in this passed-through region. It is considered that this is because a lattice defect is also formed in the passed-through region of the hydrogen ion. Therefore, adjusting the dose amount for the deepest peak 204 enables adjusting a carrier concentration in the passed-through region as well as a carrier concentration in the vicinity of the depth position Zd. Accordingly, adjusting the dose amount of the hydrogen ions for the deepest peak 204 enables adjusting an entire carrier concentration of the buffer region 20.

In setting step S1212, the dose amount for the deepest peak 204 may be set based further on the depth position Zd of the deepest peak 204. As described above, when the hydrogen ions are implanted, the hydrogen donors are also formed in the passed-through region of the hydrogen ions. A length of the passed-through region changes depending on the depth position Zd. Therefore, an integral value of a hydrogen donor formation amount when the dose amount for the deepest peak 204 is adjusted changes depending on the depth position Zd. In setting step S1212, the farther the depth position Zd of the deepest peak 204 from the lower surface 23 is, the lesser the dose amount for the deepest peak 204 can be.

Figure 3:
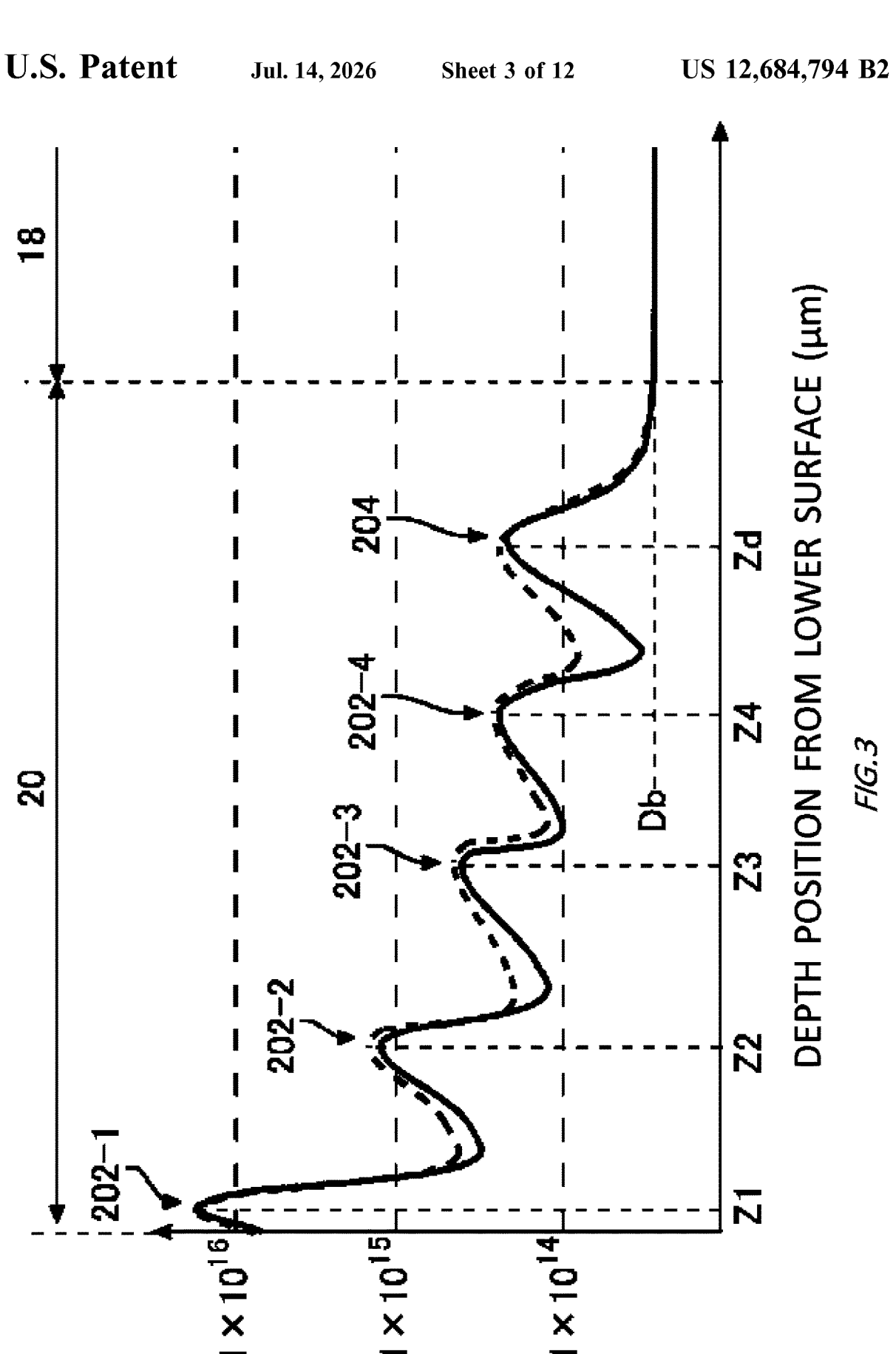
FIG. 3 illustrates one example of a carrier concentration distribution in a buffer region 20 for every carbon concentration of a semiconductor substrate 10.

FIG. 3 illustrates one example of a carrier concentration distribution in the buffer region 20 for every carbon concentration of the semiconductor substrate 10. In FIG. 3, a doping concentration of the drift region 18 is a bulk doping concentration Db. In FIG. 3, a solid line indicates an example in which the carbon concentration of the semiconductor substrate 10 is $1 \times 10^{15}/cm^3$, and a dotted line indicates an example in which the carbon concentration is $4 \times 10^{15}/cm^3$. In the two examples, dose amounts of hydrogen ions for each depth position are the same. Specifically, a dose amount of hydrogen ions for the depth position Z1 is $5 \times 10^{14}/cm^2$, for the depth position Z2 is $3 \times 10^{13}/cm^2$, for the depth position Z3 is $5 \times 10^{12}/cm^2$, for the depth position Z4 is $5 \times 10^{12}/cm^2$, and for the depth position Zd is $1 \times 10^{13}/cm^2$.

As shown in FIG. 3, in the example in which the carbon concentration is relatively low (i.e., the solid line), an overall carrier concentration in the buffer region 20 is small. As above, a concentration of hydrogen donors to be formed in the buffer region 20 changes depending on the carbon concentration.

Figure 4:
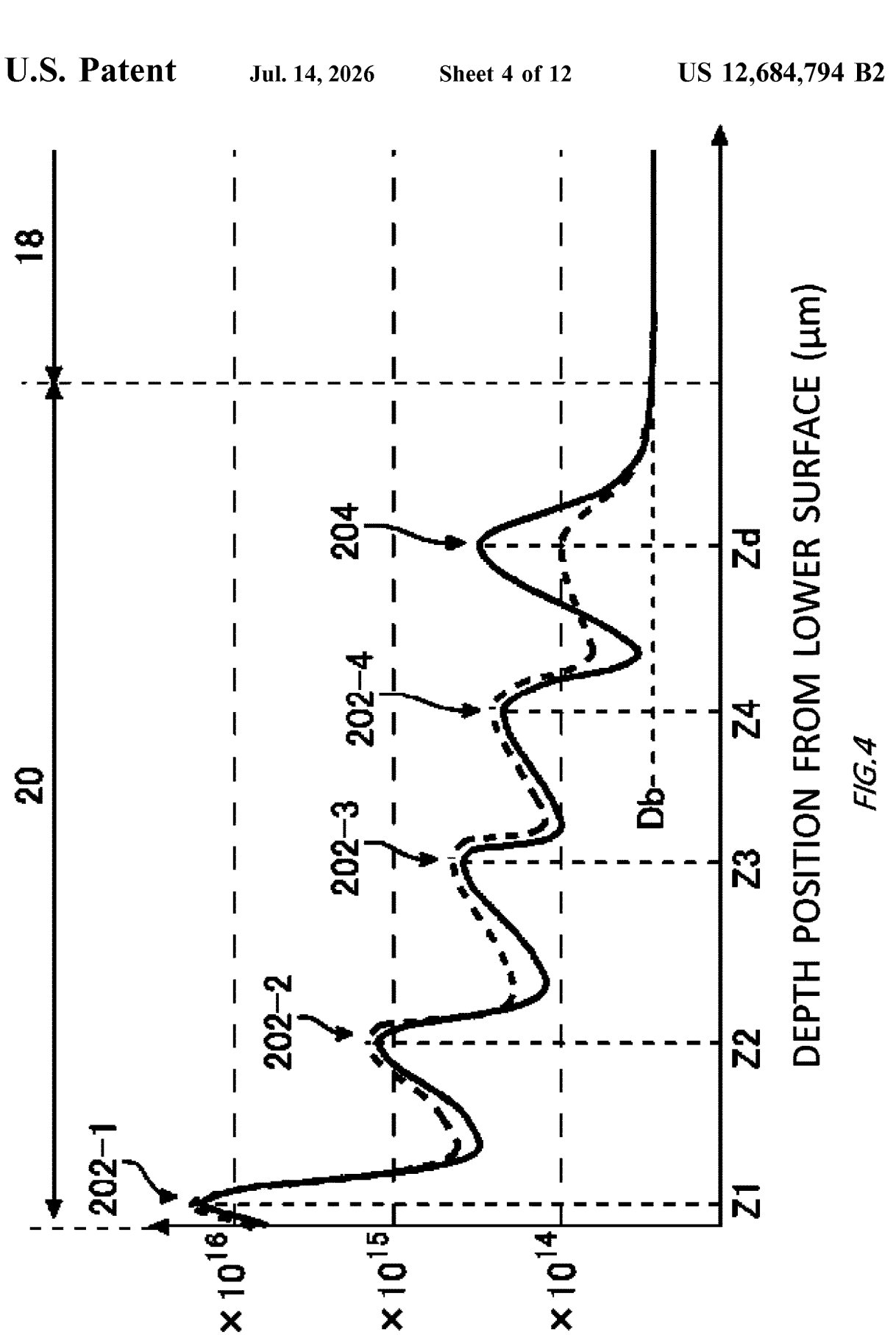
FIG. 4 illustrates one example of a carrier concentration distribution when a dose amount of hydrogen ions for a deepest peak 204 is adjusted depending on a carbon concentration.

FIG. 4 illustrates one example of a carrier concentration distribution when a dose amount of hydrogen ions for the deepest peak 204 is adjusted depending on a carbon concentration. Dose amounts of hydrogen ions for the concentration peaks 202 are the same as those in the example of FIG. 3.

In an example shown with a solid line in FIG. 4, a carbon concentration in the semiconductor substrate 10 is $1 \times 10^{15}/cm^3$, and a dose amount of hydrogen ions for the depth position Zd is $2 \times 10^{13}/cm^2$. That is, in the example shown with the solid line in FIG. 4, the dose amount of the hydrogen ions at the depth position Zd is twice as much as that of the example shown with the solid line in FIG. 3. Therefore, a concentration at the deepest peak 204 is high.

In an example shown with a dotted line in FIG. 4, a carbon concentration of the semiconductor substrate 10 is $4 \times 10^{15}/cm^3$, and a dose amount of hydrogen ions for the depth position Zd is $3 \times 10^{12}/cm^2$. That is, in the example shown with the dotted line in FIG. 4, the dose amount of the hydrogen ion at the depth position Zd is 30% of that in the example shown with the dotted line in FIG. 3. Therefore, a concentration at the deepest peak 204 is low.

In the two examples shown in FIG. 4, integral values of the carrier concentration in the buffer region 20 are almost equal. As above, by adjusting the dose amount of the hydrogen ions for the depth position Zd depending on the carbon concentration, integral values of the carrier concentration in the buffer region 20 can be adjusted to be almost a certain value.

Figure 5:
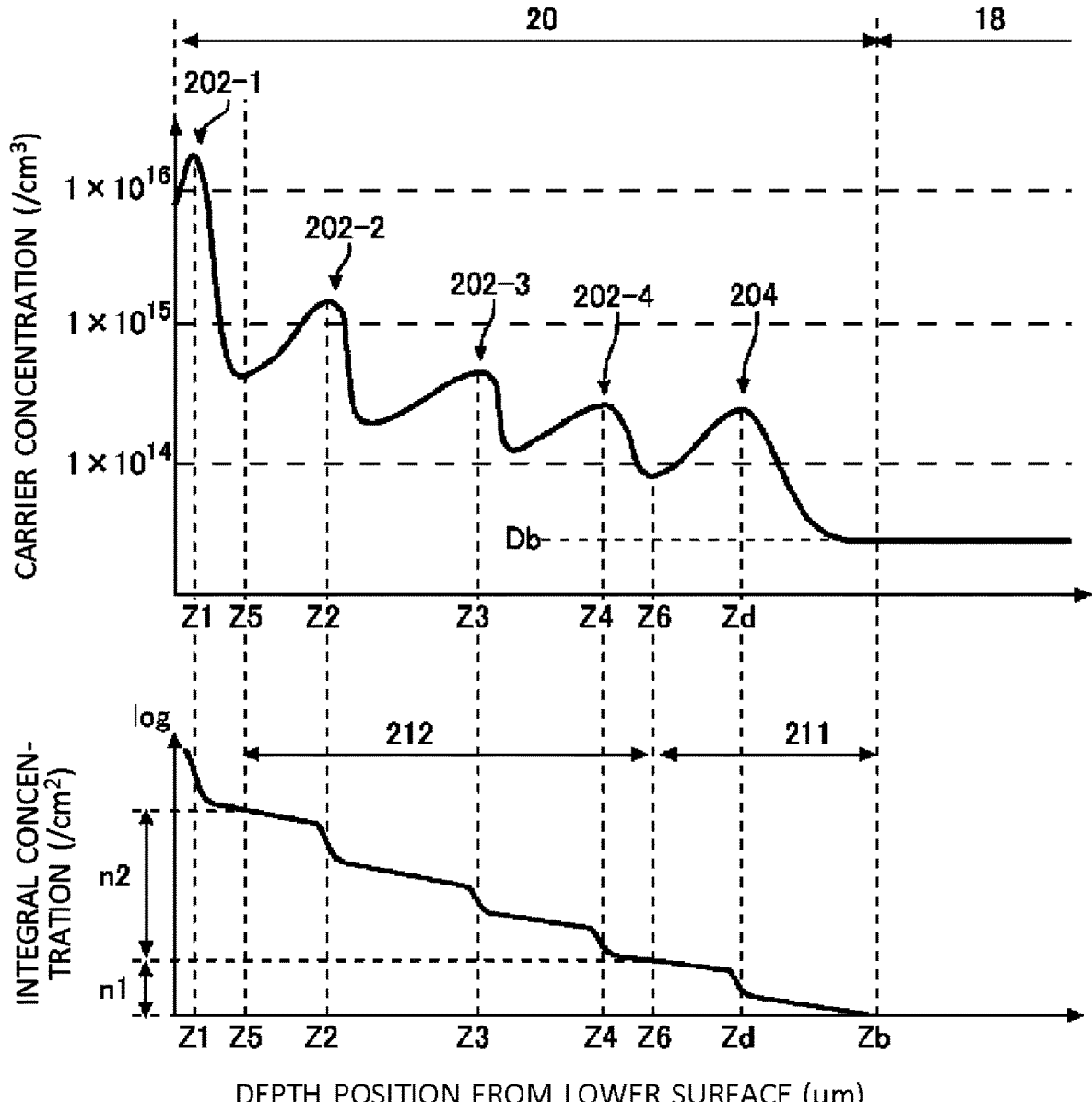
FIG. 5 illustrates examples of a carrier concentration distribution of the buffer region 20, and an integral value of a carrier concentration.

FIG. 5 illustrates examples of a carrier concentration distribution of the buffer region 20, and an integral value of a carrier concentration. The carrier concentration distribution shown in FIG. 5 is a distribution obtained before the dose amount of hydrogen ions for the depth position Zd is adjusted depending on a carbon concentration. An integral concentration is a value obtained by integrating the carrier concentration from a boundary position Zb between the buffer region 20 and the drift region 18 toward the lower surface 23.

A plurality of concentration peaks of the buffer region 20 of this example includes a first shallow peak closest to the lower surface 23 of the semiconductor substrate 10, and a second shallow peak that is second closest to the lower surface 23. In the example illustrated in FIG. 5, a concentration peak 202-1 corresponds to the first shallow peak, and a concentration peak 202-2 corresponds to the second shallow peak. In addition, the plurality of concentration peaks of the buffer region 20 includes a second deep peak that is second farthest from the lower surface 23 of the semiconductor substrate 10. In the example illustrated in FIG. 5, a concentration peak 202-4 corresponds to the second deep peak.

A position Z5 is a depth position of a boundary between the concentration peak 202-1 and concentration peak 202-2. The depth position Z5 is where a carrier concentration becomes a minimum value between the concentration peak 202-1 and the concentration peak 202-2. If there is a flat portion, where a region having the carrier concentration of the minimum value continues, between the concentration peak 202-1 and the concentration peak 202-2, the depth position Z5 may be at a center position in a depth direction in this flat portion. A position Z6 is a depth position of a boundary between the concentration peak 202-4 and the deepest peak 204. The depth position Z6 is where a carrier concentration becomes a minimum value between the concentration peak 202-4 and the deepest peak 204. If there is a flat portion, where a region having the carrier concentration of the minimum value continues, between the concentration peak 202-4 and the deepest peak 204, the depth position Z6 may be at a center position in a depth direction in this flat portion.

In setting step S1212 of this example, a dose amount of hydrogen ions for the deepest peak 204 is adjusted based further on an integral value n2 of a carrier concentration from the concentration peak 202-2 to the concentration peak 202-4 in a depth direction. A region 212 is a range from the concentration peak 202-2 to the concentration peak 202-4. The region 212 is a region from the depth position Z5 to the depth position Z6.

As described above, a carrier concentration in the region 212 changes depending on a carbon concentration or an oxygen concentration of the semiconductor substrate 10. Also, a changing amount of the carrier concentration in the region 212 changes depending on a magnitude of the carrier concentration in the region 212. For example, when the carrier concentration in the region 212 is large, the changing amount of the carrier concentration depending on the carbon concentration or the oxygen concentration tends to become large. Therefore, by adjusting the dose amount of the hydrogen ions for the deepest peak 204 depending on an integral value of a carrier concentration that the region 212 should have, the change in the carrier concentration in the region 212 can be compensated more precisely by virtue of an increase/decrease in the carrier concentration at the deepest peak 204. It may be experimentally obtained in advance, or obtained through a simulation that how much the dose amount of the hydrogen ions should be adjusted depending on the integral value of the carrier concentration in the region 212.

A carrier concentration of the concentration peak 202-1 is set at a value larger than that of another concentration peak 202, so that a depletion layer expanding from an upper surface 21 side of the semiconductor substrate 10 does not reach the collector region 22 etc. For example, the carrier concentration of the concentration peak 202-1 is ten times or more than a carrier concentration of the another concentration peak 202. In such a case, if the concentration peak 202-1 is included in the region 212, the integral value in the region 212 is almost decided by the carrier concentration of the concentration peak 202-1. Therefore, in setting step S1212, the dose amount of the hydrogen ions for the deepest peak 204 is set based on an integral concentration in the region 212 which does not include the concentration peak 202-1. The concentration peak not included in the integral concentration may be a concentration peak described below. For example, it may be a concentration peak including an end portion of a depletion layer (i.e., a depletion layer end) that expands in the drift region 18 and the buffer region 20 when 90% or more voltage of a voltage with which avalanche breakdown occurs is applied to a semiconductor apparatus 100, or may be a concentration peak positioned on a side closer to the lower surface 23 than the depletion layer end.

In setting step S1212 of this example, the dose amount of the hydrogen ions for the deepest peak 204 is set based further on an integral value n1 of a carrier concentration of the buffer region 20 positioned on a side closer to the upper surface 21 than the concentration peak 202-4. A region 211 is a range of the buffer region 20 positioned on the side closer to the upper surface 21 than the concentration peak 202-4. The region 211 is a region from the depth position Z6 to the depth position Zb.

In the examples described from FIG. 1 to FIG. 4, the dose amounts of the hydrogen ions for the deepest peaks 204 are adjusted. In that case, as shown in FIG. 4, the carrier concentration of the deepest peak 204 changes. On the other hand, if the carrier concentration of the deepest peak 204 is greatly changed, a characteristic of a semiconductor apparatus may change. An electrical characteristic of the semiconductor apparatus is dependent on the integral concentration of the carrier concentration in the region 211, and this integral concentration is dependent on the dose amount of the hydrogen ions for the deepest peak 204. Therefore, it is preferable to adjust the dose amount of the hydrogen ions for the deepest peak 204 to the extent that a characteristic of the semiconductor apparatus does not change greatly.

In setting step S1212 of this example, the dose amount of the hydrogen ions is adjusted based on a ratio of the integral concentration n1 of the region 211 to the integral concentrations in the region 211 and region 212 (n1+n2), that is, (n1/(n1+n2)). Further, the hydrogen donor formation amount changes depending on the oxygen concentration of the semiconductor substrate 10. In setting step S1212, the dose amount of the hydrogen ions for the deepest peak 204 may be set based further on the oxygen concentration of the semiconductor substrate 10. Used as the oxygen concentration of the semiconductor substrate 10 may be a value at the depth position Zd, an average value over the entire buffer region 20, or an average value over the entire semiconductor substrate 10.

Figure 6:
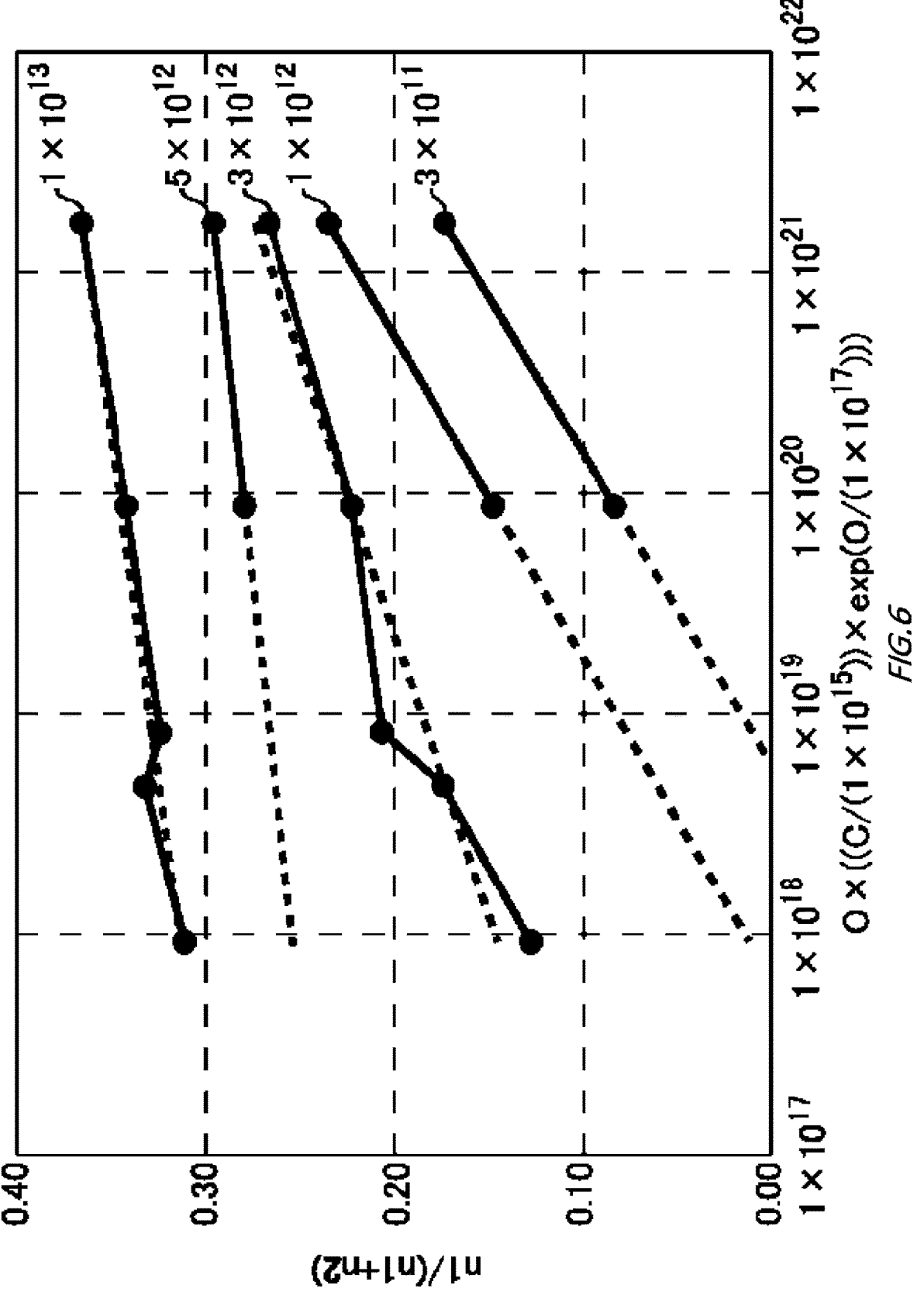
FIG. 6 illustrates one example of a relation between an integral concentration ratio (n1/(n1+n2)), and an oxygen concentration and a carbon concentration of the semiconductor substrate 10.

FIG. 6 illustrates one example of a relation between the integral concentration ratio (n1/(n1+n2)), and the oxygen concentration and carbon concentration of the semiconductor substrate 10. In an example illustrated in FIG. 6, a horizontal axis is expressed by $O \times ((C/(1 \times 10^{15})) \times exp(O/(1 \times 10^{17}))$, where C represents the carbon concentration and O represents the oxygen concentration of the semiconductor substrate 10. A vertical axis in FIG. 6 is expressed by the integral concentration ratio (n1/(n1+n2)). In FIG. 6, a characteristic is shown in each example where the dose amount of the hydrogen ions for the deepest peak 204 is $1 \times 10^{13}/cm^2$, $5 \times 10^{12}/cm^2$, $3 \times 10^{12}/cm^2$, $1 \times 10^{12}/cm^2$, or $3 \times 10^{11}/cm^2$.

As described above, the hydrogen donor formation amount is dependent on the carbon concentration or oxygen concentration of the semiconductor substrate 10, especially the oxygen concentration. By expressing the horizontal axis x with $O \times ((C/(1 \times 10^{15})) \times exp(O/(1 \times 10^{17}))$, where O is the oxygen concentration and C is the carbon concentration, each characteristic shown on a logarithmic graph could almost be approximated along a straight line, as shown by a dotted line in FIG. 6. This indicates that the integral concentration ratio is substantially dependent on the oxygen concentration, and is also affected by the carbon concentration. The higher the oxygen concentration is, the stronger it tends to be affected by the carbon concentration. In order to show this degree of being affected, the horizontal axis is expressed by a value obtained by multiplying the oxygen concentration O by $(C/(1 \times 10^{15})) \times exp(O/(1 \times 10^{17}))$. The portion expressed by $C/(1 \times 10^{15})$ is for normalizing the carbon concentration C (i.e., making the carbon concentration C dimensionless) by $1 \times 10^{15}/cm^3$. The portion expressed by $exp(O/(1 \times 10^{17}))$ is a contribution coefficient of the oxygen concentration O to the normalized carbon concentration C. The contribution coefficient is dimensionless. In other words, the horizontal axis x may represent interaction between oxygen and carbon with respect to a donor concentration of hydrogen donors, by multiplying the oxygen concentration O and a normalized carbon concentration multiplied by the contribution coefficient of the oxygen concentration together. A unit for a parameter x of the horizontal axis is atoms/cm³, which may simply be written as/cm³.

As shown in FIG. 6, the larger the dose amount of hydrogen ions at the deepest peak 204 is, the larger the integral concentration ratio (n1/(n1+n2)) becomes. Further, the larger the parameter $x = O \times ((C/(1 \times 10^{15})) \times exp(O/(1 \times 10^{17}))$ becomes, the larger the integral concentration ratio (n1/(n1+n2)) becomes.

Once an oxygen concentration O and a carbon concentration C of the semiconductor substrate 10, and the integral concentration n1 and the integral concentration n2 that the buffer region 20 should have are defined by such a relation illustrated in FIG. 6, then a dose amount of hydrogen ions that should be set for the deepest peak 204 is defined. In setting step S1212, a dose amount of hydrogen ions at the deepest peak 204 may be decided depending on the dose amount of hydrogen ions defined by using FIG. 6. Depending on a combination of values of the oxygen concentration O and the carbon concentration C of the semiconductor substrate 10 and the integral concentration n1 and integral concentration n2 that the buffer region 20 should have, an allowable range of the dose amount that should be set for the deepest peak 204 may be predetermined. This allowable range may be determined by such a relation between the parameter x and the integral concentration ratio (n1/(n1+n2)), which are illustrated in FIG. 6.

Figure 7:
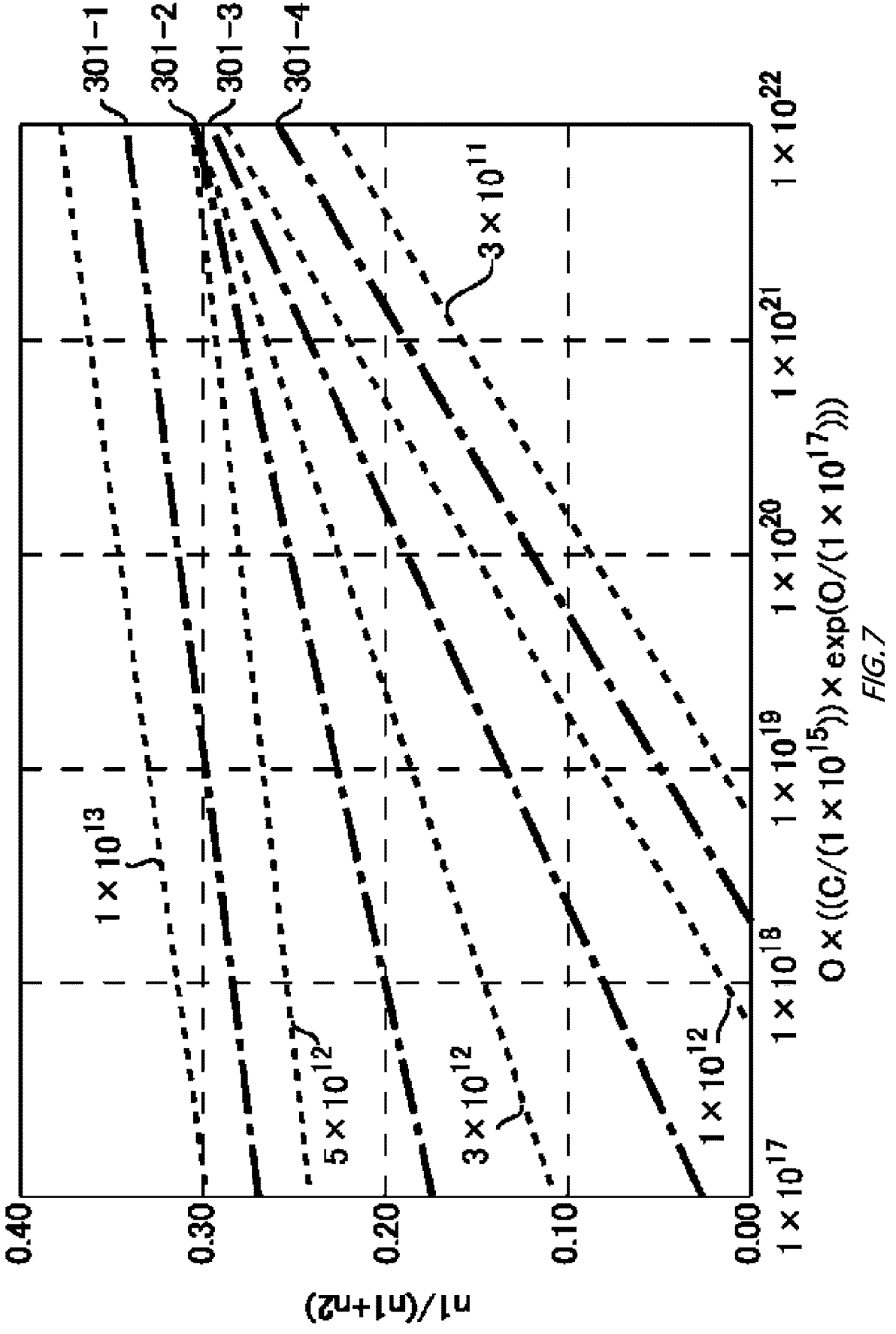
FIG. 7 illustrates allowable ranges of dose amounts of hydrogen ions that should be set for a deepest peak 204.

FIG. 7 illustrates allowable ranges of dose amounts of hydrogen ions that should be set for the deepest peak 204. In this example, those allowable ranges are decided by using a plurality of approximate straight lines shown with the dotted lines in FIG. 6. In FIG. 7, each approximate straight line is shown with a dotted line, and boundary lines 301-1 to 301-4 of the allowable ranges are shown with long dash-short dash lines. A range of the parameter x may be from $1 \times 10^{17}/cm^3$ to $1 \times 10^{22}/cm^3$.

Each boundary line 301 is a straight line in the middle of two approximate straight lines. In FIG. 7, the boundary line 301-1 is a middle line between an approximate straight line obtained when the dose amount of hydrogen ions at the deepest peak 204 is $1 \times 10^{13}/cm^2$, and an approximate straight line obtained when the dose amount of hydrogen ions at the deepest peak 204 is $5 \times 10^{12}/cm^2$. The boundary line 301-2 is a middle line between the approximate straight line obtained when the dose amount of hydrogen ions at the deepest peak 204 is $5 \times 10^{12}/cm^2$, and an approximate straight line obtained when the dose amount of hydrogen ions at the deepest peak 204 is $3 \times 10^{12}/cm^2$. The boundary line 301-3 is a middle line between the approximate straight line obtained when the dose amount of hydrogen ions at the deepest peak 204 is $3 \times 10^{12}/cm^2$, and an approximate straight line obtained when the dose amount of hydrogen ions at the deepest peak 204 is $1 \times 10^{12}/cm^2$. The boundary line 301-4 is a middle line between the approximate straight line obtained when the dose amount of hydrogen ions at the deepest peak 204 is $1 \times 10^{12}/cm^2$, and an approximate straight line obtained when the dose amount of hydrogen ions at the deepest peak 204 is $3 \times 10^{11}/cm^2$.

Parameters x and y are defined by the following mathematical expressions. Here, ln(x) is a natural logarithm of x.

$$x=O\times((C/(1\times10^{15}))\times\exp(O/(1\times10^{17}))$$

$$y=n1/(n1+n2)$$

The boundary line 301-1 is expressed by the following mathematical expression.

$$y=6.167\times10^{-3}\times\ln(x)+2.860\times10^{-2}$$

The boundary line 301-2 is expressed by the following mathematical expression.

$$y=1.129\times10^{-2}\times\ln(x)-2.660\times10^{-1}$$

The boundary line 301-3 is expressed by the following mathematical expression.

$$y=2.250\times10^{-2}\times\ln(x)-8.436\times10^{-1}$$

The boundary line 301-4 is expressed by the following mathematical expression.

$$y=3.017\times10^{-2}\times\ln(x)-1.272$$

In the graph illustrated in FIG. 7, if the parameters x and y, which are defined by a combination of values of the oxygen concentration O and the carbon concentration C of the semiconductor substrate 10 and the integral concentration n1 and the integral concentration n2 that the buffer region 20 should have, are in a region above the boundary line 301-1, the dose amount for the deepest peak 204 may be set to be $8\times10^{12}/cm^2$ or more in setting step S1212.

That is, if $6.167\times10^{-3}\times\ln(x)+2.860\times10^{-2}\leq y<0.4$ is satisfied, the dose amount for the deepest peak 204 may be set to be $8\times10^{12}/cm^2$ or more in setting step S1212. The dose amount for the deepest peak 204 can also be set to be $9\times10^{12}/cm^2$ or more. In that case, the dose amount for the deepest peak 204 may be set to be less than $1.2\times10^{13}/cm^2$. Further, the dose amount for the deepest peak 204 can also be set to be less than $1.1\times10^{13}/cm^2$.

In the graph illustrated in FIG. 7, if the parameters x and y are between the boundary line 301-1 and the boundary line 301-2, the dose amount for the deepest peak 204 may be set to be $4\times10^{12}/cm^2$ or more, and less than $8\times10^{12}/cm^2$ in setting step S1212.

That is, if $1.129\times10^{-2}\times\ln(x)-2.660\times10^{-1}\leq y<6.167\times10^{-3}\times\ln(x)+2.860\times10^{-2}$ is satisfied, the dose amount for the deepest peak 204 may be set to be $4\times10^{12}/cm^2$ or more, and less than $8\times10^{12}/cm^2$ in setting step S1212. In that case, the dose amount for the deepest peak 204 may be set to be $4\times10^{12}/cm^2$ or more. In that case also, the dose amount for the deepest peak 204 may be set to be $7\times10^{12}/cm^2$ or less.

In the graph illustrated in FIG. 7, if the parameters x and y are between the boundary line 301-2 and the boundary line 301-3, the dose amount for the deepest peak 204 may be set to be $2\times10^{12}/cm^2$ or more, and less than $4\times10^{12}/cm^2$ in setting step S1212.

That is, if $2.250\times10^{-2}\times\ln(x)-8.436\times10^{-1}\leq y<1.129\times10^{-2}\times\ln(x)-2.660\times10^{-1}$ is satisfied, the dose amount for the deepest peak 204 may be set to be $2\times10^{12}/cm^2$ or more, and less than $4\times10^{12}/cm^2$ in setting step S1212. In that case, the dose amount for the deepest peak 204 may be set to be $2.5\times10^{12}/cm^2$ or more. In that case also, the dose amount for the deepest peak 204 may be set to be $3.5\times10^{12}/cm^2$ or less.

In the graph illustrated in FIG. 7, if the parameters x and y are between the boundary line 301-3 and the boundary line 301-4, the dose amount for the deepest peak 204 may be set to be $5\times10^{12}/cm^2$ or more, and less than $2\times10^{12}/cm^2$ in setting step S1212.

That is, if $3.017\times10^{-2}\times\ln(x)-1.272\leq y<2.250\times10^{-2}\times\ln(x)-8.436\times10^{-1}$ is satisfied, the dose amount for the deepest peak 204 may be set to be $5\times10^{11}/cm^2$ or more, and less than $2\times10^{12}/cm^2$ in setting step S1212. In that case, the dose amount for the deepest peak 204 may be set to be $8\times10^{11}/cm^2$ or more. In that case also, the dose amount for the deepest peak 204 may be set to be $1\times10^{12}/cm^2$ or less.

In the graph illustrated in FIG. 7, if the parameters x and y are below the boundary line 301-4, the dose amount for the deepest peak 204 may be set to be less than $5\times10^{11}/cm^2$ in setting step S1212.

That is, if $0.01\leq y<3.017\times10^{-2}\times\ln(x)-1.272$ is satisfied, the dose amount for the deepest peak 204 may be set to be less than $5\times10^{11}/cm^2$ in setting step S1212. The dose amount for the deepest peak 204 may be set to be $4\times10^{11}/cm^2$ or less. In that case, the dose amount for the deepest peak 204 may be set to be $1\times10^{11}/cm^2$ or more, or $2\times10^{11}/cm^2$ or more.

Figure 8:
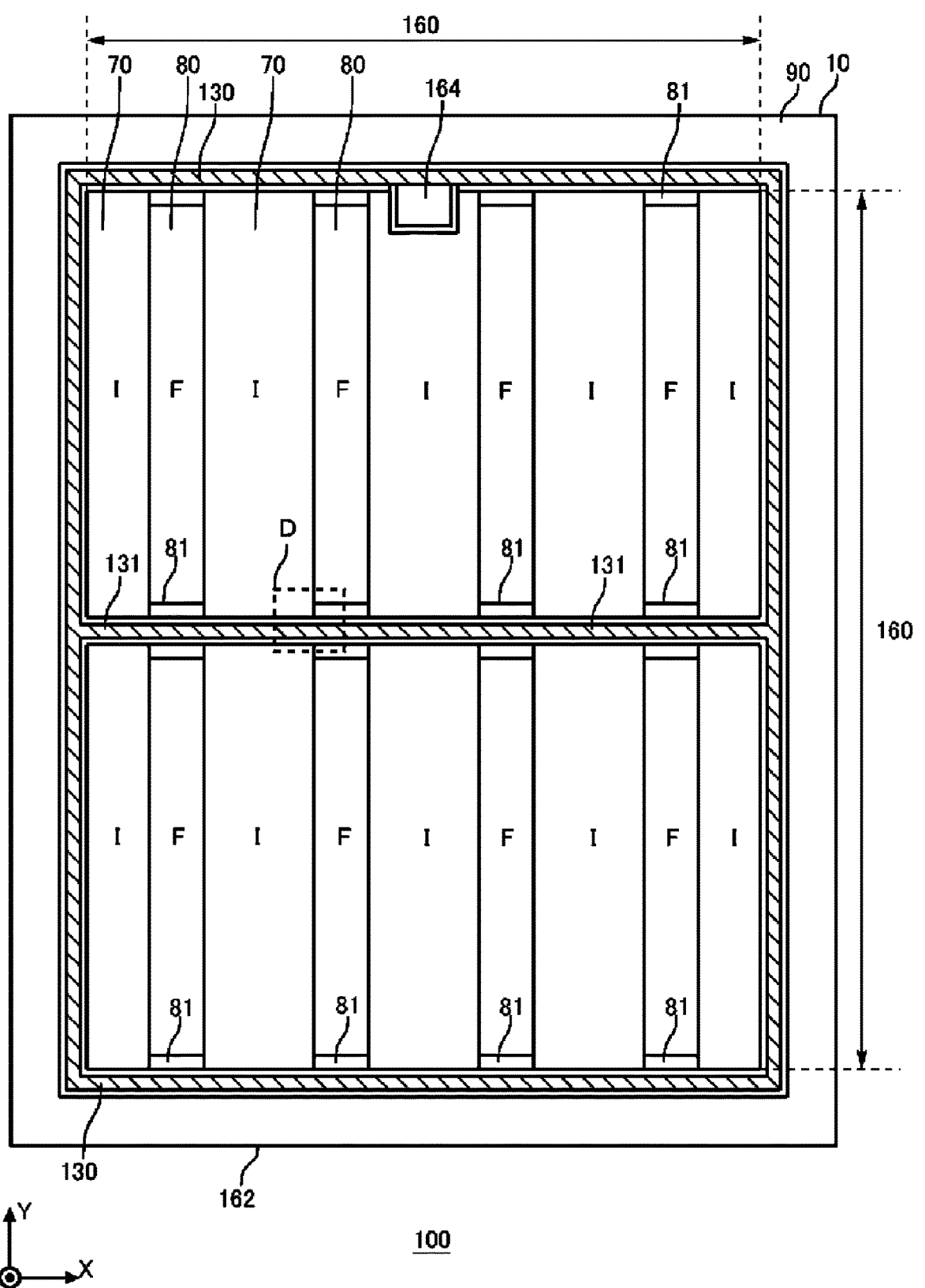
FIG. 8 illustrates a top view showing one example of the semiconductor apparatus 100 manufactured by using the manufacturing methods described from FIG. 1 to FIG. 7.

FIG. 8 illustrates a top view showing one example of the semiconductor apparatus 100 manufactured by using the manufacturing methods described from FIG. 1 to FIG. 7. FIG. 8 shows a position at which each member is projected on an upper surface of a semiconductor substrate 10. FIG. 8 shows merely some members of the semiconductor apparatus 100, and omits illustrations of some members.

The semiconductor apparatus 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in the top view. When merely referred to as the top view in the present specification, it means that the semiconductor substrate 10 is viewed from an upper surface side. The semiconductor substrate 10 of this example has two sets of end sides 162 opposite to each other in the top view. In FIG. 8, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor apparatus 100 operates. An emitter electrode is provided above the active portion 160, but is omitted in FIG. 8.

The active portion 160 is provided with at least one of a transistor portion 70 including a transistor element such as an IGBT, and a diode portion 80 including a diode element such as a freewheeling diode (FWD). In the example of FIG. 8, the transistor portion 70 and the diode portion 80 are alternately arranged along a predetermined array direction (the X axis direction in this example) on the upper surface of the semiconductor substrate 10. The active portion 160 in another example may be provided with only one of the transistor portion 70 and the diode portion 80.

In FIG. 8, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 8). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described below may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of P+ type of may be provided in a region other than the cathode region. In the specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor apparatus 100 may have one or more pads above the semiconductor substrate 10. The semiconductor apparatus 100 of this example has a gate pad 164. The semiconductor apparatus 100 may have a pad such as an anode pad, a cathode pad, and a current detection pad. Each pad is arranged in a region close to the end side 162. The region close to the end side 162 refers to a region between the end side 162 and the emitter electrode in the top view. When the semiconductor apparatus 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor apparatus 100 includes a gate runner that connects the gate pad 164 and the gate trench portion. In FIG. 8, the gate runner is hatched with diagonal lines.

The gate runner of this example has an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of this example encloses the active portion 160 in the top view. A region enclosed by the outer circumferential gate runner 130 in the top view may be the active portion 160. Further, the outer circumferential gate runner 130 is connected to the gate pad 164. The outer circumferential gate runner 130 is arranged above the semiconductor substrate 10. The outer circumferential gate runner 130 may be a metal wiring including aluminum etc.

The active-side gate runner 131 is provided in the active portion 160. Providing the active-side gate runner 131 in the active portion 160 can reduce a variation in wiring length from the gate pad 164 for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130, which sandwich the active portion 160, substantially in the middle of the Y axis direction. When the active portion 160 is divided by the active-side gate runner 131, the transistor portion 70 and the diode portion 80 may be alternately arranged in the X axis direction in each divided region.

The semiconductor apparatus 100 may include a temperature sensing portion (not shown) that is a PN junction diode formed of polysilicon or the like, and a current detection portion (not shown) that simulates an operation of the transistor portion provided in the active portion 160.

The semiconductor apparatus 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160.

Figure 9:
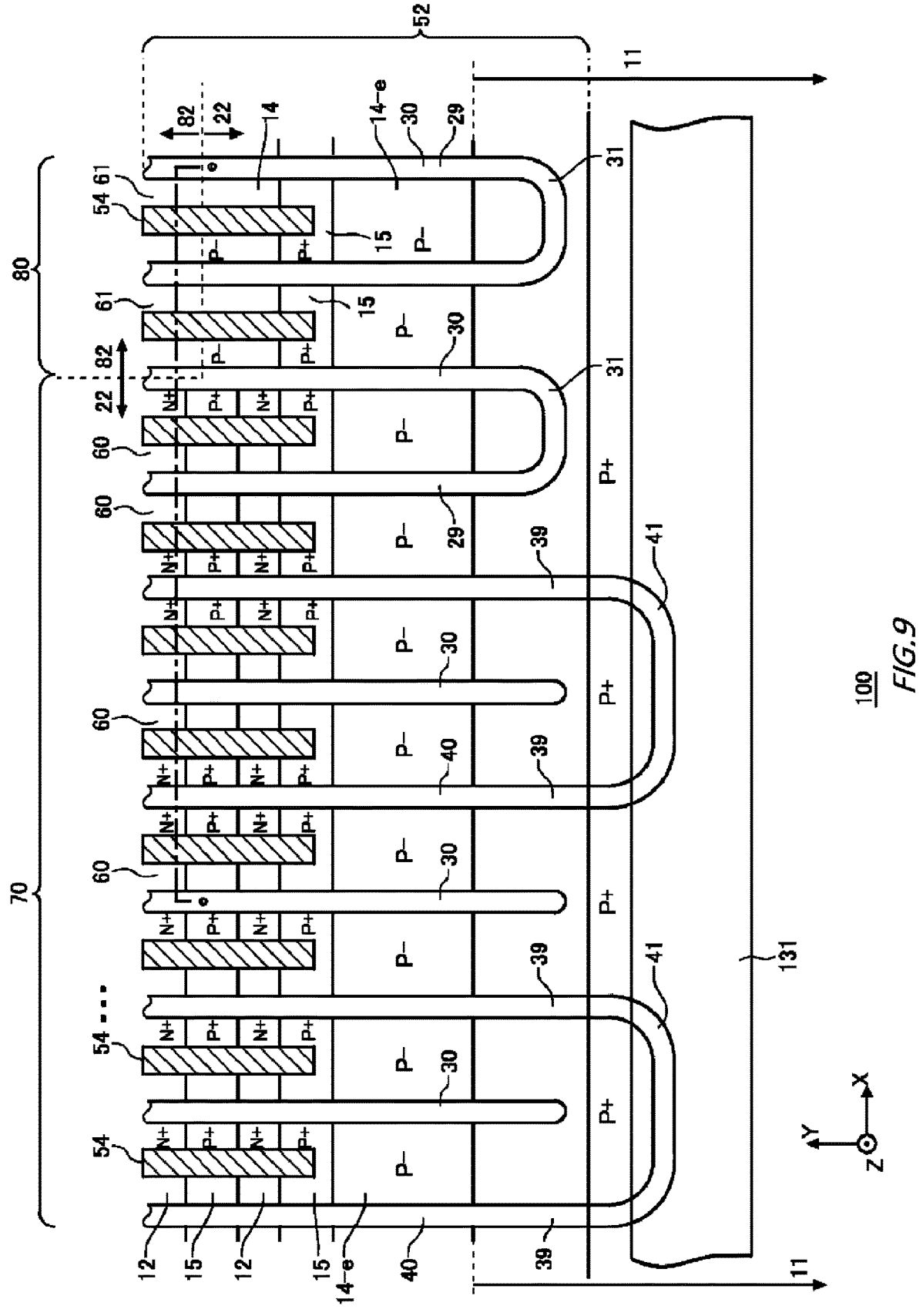
FIG. 9 illustrates an enlarged view of a region D illustrated in FIG. 8.

FIG. 9 illustrates an enlarged view of a region D in FIG. 8. The region D is a region including the transistor portion 70, the diode portion 80, and the active-side gate runner 131. The semiconductor apparatus 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are one example of the trench portion. Further, the semiconductor apparatus 100 of this example includes an emitter electrode 52 and the active-side gate runner 131 that are provided above the upper surface of the semiconductor substrate 10. The emitter electrode 52 and the active-side gate runner 131 are provided in isolation with each other.

An interlayer dielectric film is provided between the emitter electrode 52 and the active-side gate runner 131, and the upper surface of the semiconductor substrate 10, but the interlayer dielectric film is omitted in FIG. 9. In the interlayer dielectric film of this example, a contact hole 54 is provided passing through this interlayer dielectric film. In FIG. 9, each contact hole 54 is hatched with the diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including a metal. FIG. 9 shows a range where the emitter electrode 52 is provided. For example, at least a part of a region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 9 is the Y axis direction.

At least a part of the edge portion 41 is preferably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, or may have linear portions 29 and an edge portion 31 similar to the gate trench portion 40. The semiconductor apparatus 100 shown in FIG. 9 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom portion in the depth direction of each trench portion is covered with the well region 11 at the end portion in the Y axis direction of each trench portion. With this configuration, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench, on the upper surface of the semiconductor substrate 10. In this example, a mesa portion 60 is provided in the transistor portion 70, and a mesa portion 61 is provided in the diode portion 80. In the case of simply referring to a phrase "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 9 shows the base region 14-e arranged at one end portion of each mesa portion in the extending direction, the base region 14-e is also arranged at the other end portion of each mesa portion. Each mesa portion may be provided with at least one of a first conductivity type of emitter region 12, and a second conductivity type of contact region 15 in a region sandwiched between the base regions 14-e in the top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-*e*. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-*e*. The contact hole 54 of this example is provided above respective regions of the contact region 15, the base region 14, and the emitter region 12. The contact hole 54 is not provided in regions corresponding to the base region 14-*e* and the well region 11. The contact hole 54 may be arranged in the middle of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. The cathode region 82 and the collector region 22 are provided between a lower surface 23 of the semiconductor substrate 10 and a buffer region 20. In FIG. 9, a boundary between the cathode region 82 and the collector region 22 is indicated by a dotted line.

The cathode region 82 is arranged separately from the well region 11 in the Y axis direction. With this configuration, the distance between the P type region (the well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 10:
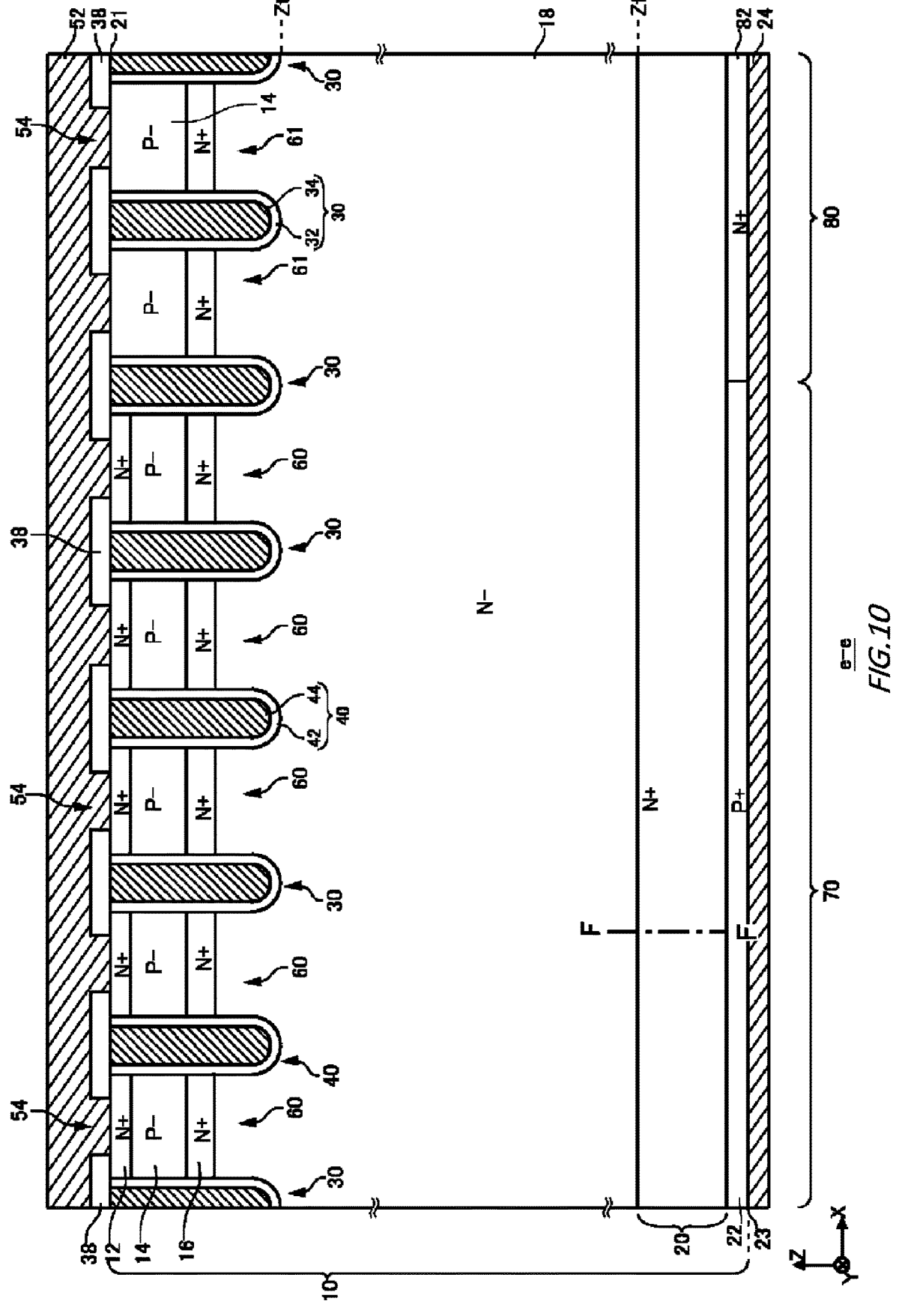
FIG. 10 illustrates one example of a cross section e-e illustrated in FIG. 9.

FIG. 10 illustrates a view showing one example of a cross section e-e in FIG. 9. The cross section e-e is an XZ plane passing through the emitter region 12 and the cathode region 82. The semiconductor apparatus 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorus is added, a thermal oxide film, and other dielectric films. The interlayer dielectric film 38 is provided with the contact hole 54 described in FIG. 9.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

The semiconductor substrate 10 includes a drift region 18 being N type or N– type. The drift region 18 is provided in each of the transistor portion 70 and the diode portion 80.

In the mesa portion 60 of the transistor portion 70, an N+ type of emitter region 12 and a P– type of base region 14 are provided in order from an upper surface 21 side of the semiconductor substrate 10. The drift region 18 is provided below the base region 14. The mesa portion 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region with a higher doping concentration than the drift region 18. That is, the accumulation region 16 has a donor concentration higher than that of the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P– type of base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 may have a concentration peak having a higher doping concentration than the doping concentration of the drift region 18. The doping concentration of the concentration peak indicates a doping concentration at the local maximum of the concentration peak. Further, as the doping concentration of the drift region 18, an average value of doping concentrations in the region where the doping concentration distribution is substantially flat may be used.

The buffer region 20 may have two or more concentration peaks in the depth direction (Z axis direction) of the semiconductor substrate 10. The concentration peak of the buffer region 20 may be provided at the same depth position as, for example, a chemical concentration peak of hydrogen (a proton) or phosphorus. The buffer region 20 may function as a field stopper layer which prevents a depletion layer expanding from the lower end of the base region 14 from reaching the collector region of the P+ type 22 and the cathode region 82 of the N+ type. In the present specification, a depth position of an upper end of the buffer region 20 is set as Zf. The depth position Zf may be a position at which the doping concentration is higher than the doping concentration of the drift region 18.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorus. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and reaches the drift region 18. In a region where at least any one of the emitter region 12, the contact region 15, and the accumulation region 16 is provided, each trench portion also passes through the doping regions of these to reach the drift region 18. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottom portions of the dummy trench portion 30 and the gate trench portion 40 may be formed in a curved-surface shape (a curved-line shape in the cross section) convexly downward. In the present specification, a depth position of a lower end of the gate trench portion 40 is set as Zt.

The buffer region 20 illustrated in FIG. 10 has the same carrier concentration distribution as the buffer regions 20 described from FIG. 1 to FIG. 7. That is, the buffer region 20 has a carrier concentration distribution of which dose amount of hydrogen ions for a deepest peak 204 is adjusted depending on a carbon concentration C or the like of the semiconductor substrate 10.

An integral concentration of hydrogen chemical concentrations in the buffer region 20 of the semiconductor apparatus 100 corresponds to the dose amounts of hydrogen ions described from FIG. 1 to FIG. 7. For example, the dose amount of hydrogen ions for the deepest peak 204 corresponds to the integral concentration of the hydrogen chemical concentrations in a depth direction in the buffer region 20 on a side closer to the upper surface 21 than the concentration peak 202-4 (i.e., the region 211 in FIG. 5).

Therefore, similar to the example explained in FIG. 7, an allowable range of the integral concentration of the hydrogen chemical concentrations in the depth direction in the region 211 is determined depending on which condition is satisfied by parameters x and y. This integral concentration in the region 211 may be within this allowable range. In this way, influence caused by variations in the oxygen concentration and the carbon concentration of the semiconductor substrate 10 is reduced, and thus the carrier concentration distribution of the buffer region 20 can be close to the predetermined integral value $n1/(n1+n2)$. A range of the parameter x may be from $1\times10^{17}/\text{cm}^3$ to $1\times10^{22}/\text{cm}^3$.

Specifically, if $6.167\times10^{-3}\times\ln(x)+2.860\times10^{-2}\leq y<0.4$ is satisfied, the integral concentration of the hydrogen chemical concentrations in the region 211 may be $8\times10^{12}/\text{cm}^2$ or more. The integral concentration of the hydrogen chemical concentrations in the region 211 can also be $9\times10^{12}/\text{cm}^2$ or more. The integral concentration of the hydrogen chemical concentrations in the region 211 may be less than $1.2\times10^{13}/\text{cm}^2$, or may also be less than $1.1\times10^{13}/\text{cm}^2$.

If $1.129\times10^{-2}\times\ln(x)-2.660\times10^{-1}\leq y<6.167\times10^{-3}\times\ln(x)+2.860\times10^{-2}$ is satisfied, the integral concentration of the hydrogen chemical concentrations in the region 211 may be $4\times10^{12}/\text{cm}^2$ or more, and less than $8\times10^{12}/\text{cm}^2$. The integral concentration of the hydrogen chemical concentrations in the region 211 can be $4\times10^{12}/\text{cm}^2$ or more, and $7\times10^{12}/\text{cm}^2$ or less.

If $2.250 \times 10^{-2} \times \ln(x) - 8.436 \times 10^{-1} \leq y < 1.129 \times 10^{-2} \times \ln(x) - 2.660 \times 10^{-1}$ is satisfied, the integral concentration of the hydrogen chemical concentrations in the region 211 may be $2 \times 10^{12} / cm^2$ or more, and less than $4 \times 10^{12} / cm^2$. The integral concentration of the hydrogen chemical concentrations in the region 211 can also be $2.5 \times 10^{12} / cm^2$ or more, and $3.5 \times 10^{12} / cm^2$ or less.

If $3.017 \times 10^{-2} \times \ln(x) - 1.272 \leq y < 2.250 \times 10^{-2} \times \ln(x) - 8.436 \times 10^{-1}$ is satisfied, the integral concentration of the hydrogen chemical concentrations in the region 211 may be $5 \times 10^{11} / cm^2$ or more, and less than $2 \times 10^{12} / cm^2$. The integral concentration of the hydrogen chemical concentrations in the region 211 can also be $8 \times 10^{11} / cm^2$ or more, and $1 \times 10^{12} / cm^2$ or less.

If $0.01 \leq y < 3.017 \times 10^{-2} \times \ln(x) - 1.272$ is satisfied, the integral concentration of the hydrogen chemical concentrations in the region 211 may be less than $5 \times 10^{11} / cm^2$. The integral concentration of the hydrogen chemical concentrations in the region 211 can be less than $5 \times 10^{11} / cm^2$, $4 \times 10^{11} / cm^2$ or less, $1 \times 10^{11} / cm^2$ or more, and $2 \times 10^{11} / cm^2$ or more.

Figure 11:
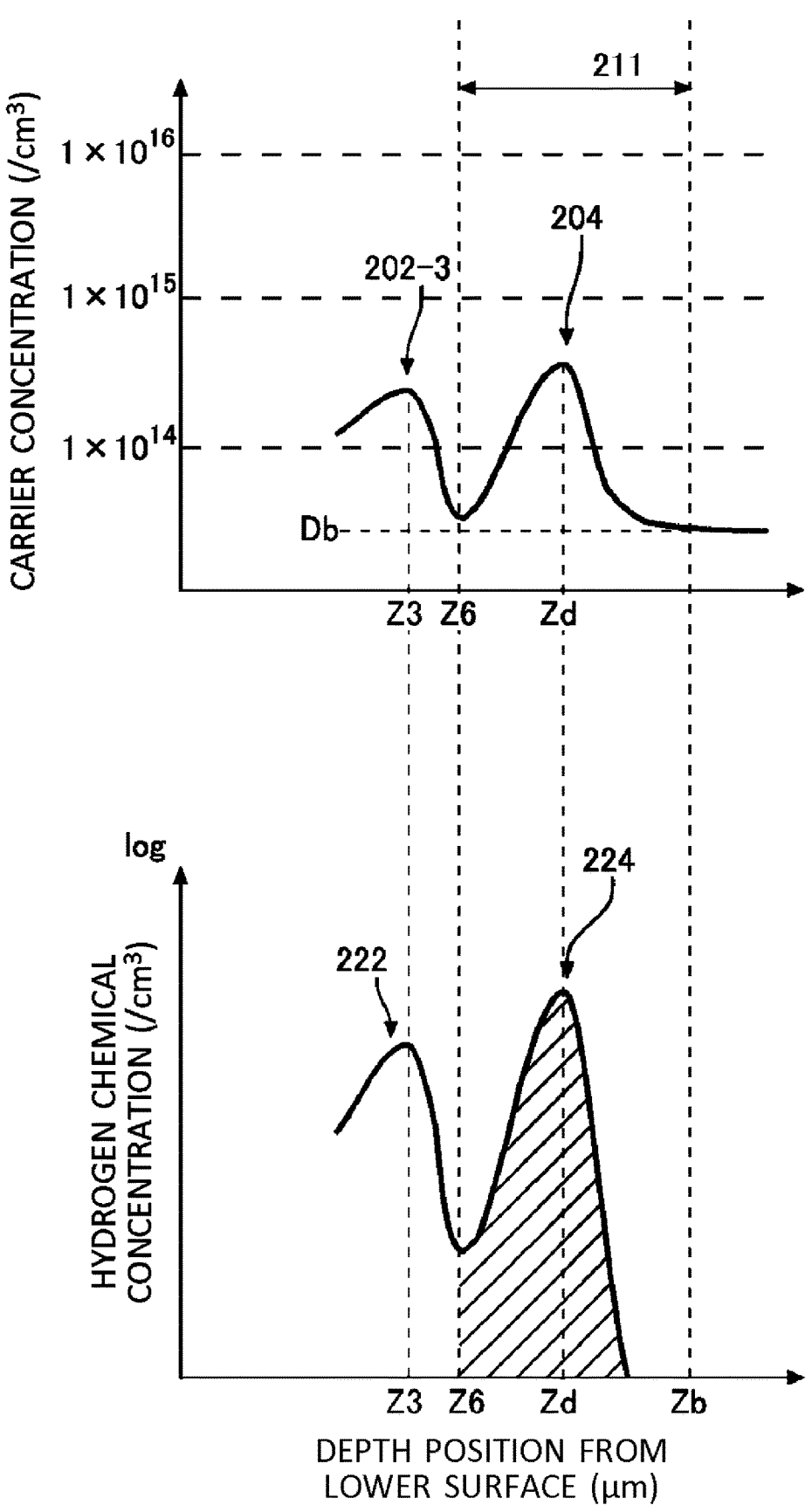
FIG. 11 is a diagram for explaining an integral concentration of hydrogen chemical concentrations in a region 211.

FIG. 11 is a diagram for explaining the integral concentration of the hydrogen chemical concentrations in the region 211. A hydrogen chemical concentration distribution in the buffer region 20 has one or more concentration peaks 222, and a deepest peak 224. The deepest peak 224 corresponds to a deepest peak 204 in a carrier concentration distribution. The concentration peaks 222 correspond to concentration peaks 202 in the carrier concentration distribution.

The integral concentration of the hydrogen chemical concentrations in the region 211 is a value obtained by integrating a hydrogen chemical concentration from a depth position Z6 to a depth position Zb in a depth direction. That is, it corresponds to an area shown with a portion hatched with diagonal lines in FIG. 11. Note that, when the integral concentration of the hydrogen chemical concentrations in the region 211 and a dose amount of hydrogen ions for the deepest peak 204 were compared, there was an error of a few percent or less. A value a obtained by dividing the dose amount of hydrogen ions for the deepest peak 204 by the integral concentration of the hydrogen chemical concentrations in the region 211 may be from one to three, from one to two, from one to 1.5, or from one to 1.1.

Figure 12:
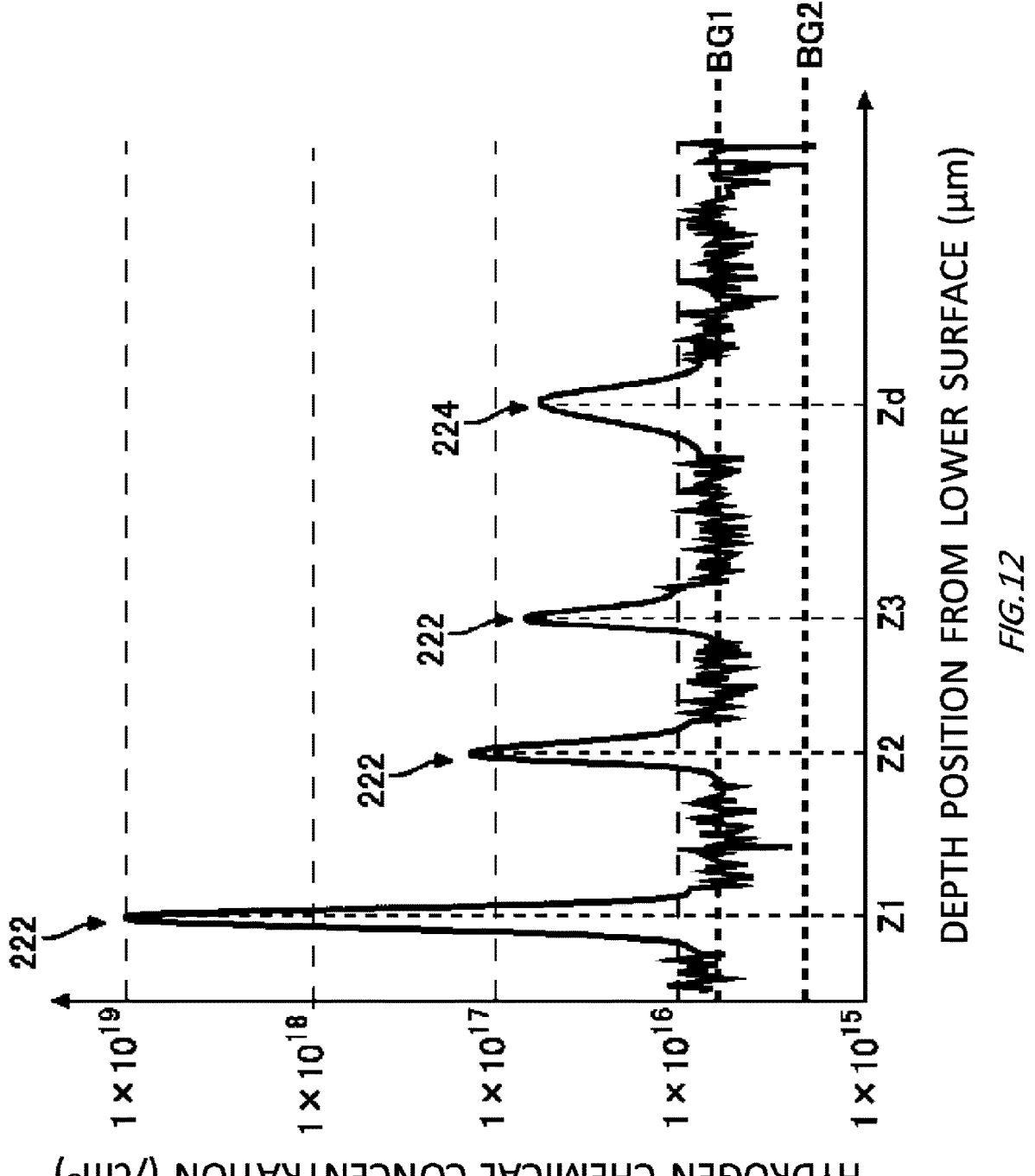
FIG. 12 illustrates one example of a hydrogen chemical concentration distribution in the buffer region 20.

FIG. 12 illustrates a diagram showing one example of a hydrogen chemical concentration distribution in the buffer region 20. In FIG. 12, a hydrogen chemical concentration distribution obtained by SIMS analysis is shown. A background component, i.e., noise derived from a detection limit, may be contained in the hydrogen chemical concentration distribution in the buffer region 20. In FIG. 12, there is noise occurring between each peak.

As the hydrogen chemical concentrations explained in FIGS. 10 and 11, a value calculated by removing the background component from measurement values may be used. As a value of the background component, a minimum value BG2 of measurement values in the hydrogen chemical concentration in the buffer region 20 may be used, or an average value BG1 of portions where values in these measurement values are finely fluctuating may be used. As the average value BG1, an average value of portions that has remained after excluding each peak range in Gaussian distribution from the hydrogen chemical concentration distribution of the buffer region 20 may be used. In this way, the hydrogen chemical concentrations can be precisely measured.

While the embodiments of the present invention have been explained, the technical scope of the present invention is not limited to the above-described embodiments. It is apparent to persons skilled in the art that various alterations or improvements can be added to the above-described embodiments. It is also apparent from the scope of the claims that the embodiments added with such alterations or improvements can be included in the technical scope of the present invention.

It should be noted that the operations, procedures, steps, stages, or the like of each process performed by an apparatus, system, program, and method shown in the claims, specification, or diagrams can be performed in any order as long as the order is not specifically indicated by "prior to", "before", or the like and as long as the output from a previous process is not used in a later process. Even if the operation flow is described by using phrases such as "first" or "next" in the scope of the claims, specification, or diagrams, it does not necessarily mean that the process must be performed in this order.

What is claimed is:

1. A manufacturing method of a semiconductor apparatus, wherein the semiconductor apparatus includes a drift region of a first conductivity type provided in a semiconductor substrate having an upper surface and a lower surface, and a buffer region of a first conductivity type which is provided between the drift region and the lower surface of the semiconductor substrate and includes a plurality of concentration peaks of which carrier concentrations are higher than that of the drift region, and the method comprises:

setting, depending on a distribution of the carrier concentrations that the buffer region should have, dose amounts of hydrogen ions to be implanted into a plurality of depth positions corresponding to the plurality of concentration peaks; and implanting, depending on the dose amounts that are set in the setting, the hydrogen ions into the semiconductor substrate, wherein in the setting, among the plurality of concentration peaks, the dose amount of the hydrogen ions for a deepest peak farthest from the lower surface of the semiconductor substrate is set depending on a carbon concentration of the semiconductor substrate, and the dose amount for at least one of the concentration peaks among the concentration peaks other than the deepest peak is set regardless of the carbon concentration of the semiconductor substrate.

2. The manufacturing method of the semiconductor apparatus according to claim 1, wherein in the setting, among the plurality of concentration peaks, the dose amounts for all of the concentration peaks other than the deepest peak are set regardless of the carbon concentration of the semiconductor substrate.

3. The manufacturing method of the semiconductor apparatus according to claim 2, wherein in the setting, the dose amount for the deepest peak is set based further on a depth position of the deepest peak.

4. The manufacturing method of the semiconductor apparatus according to claim 1, wherein:

the plurality of concentration peaks includes a second shallow peak that is second closest from the lower surface of the semiconductor substrate, and a second deep peak that is second farthest from the lower surface of the semiconductor substrate; and in the setting, the dose amount for the deepest peak is set based further on an integral value n2 of the carrier concentrations from the second shallow peak to the second deep peak.

5. The manufacturing method of the semiconductor apparatus according to claim 4, wherein in the setting, the dose amount for the deepest peak is set based further on an integral value n1 of the carrier concentrations of the buffer region on a side closer to the upper surface than the second deep peak.

6. The manufacturing method of the semiconductor apparatus according to claim 5, wherein in the setting, the dose amount for the deepest peak is set based further on an oxygen concentration of the semiconductor substrate.

7. The manufacturing method of the semiconductor apparatus according to claim 6, wherein in the setting, an allowable range of the dose amount that should be set for the deepest peak is predetermined depending on a combination of values of the carbon concentration C of the semiconductor substrate, the oxygen concentration O of the semiconductor substrate, the integral value n1, and the integral value n2, and the dose amount within the allowable range is set for the deepest peak.

8. The manufacturing method of the semiconductor apparatus according to claim 7, wherein
when $x=O\times((C/(1\times10^{15}))\times\exp(O/(1\times10^{17}))$, and $$y=n1/(n1+n2),$$

if x is from $1\times1017[/cm3]$ to $1\times1022[/cm3]$, and $6.167\times10^{-3}\times\ln(x)+2.860\times10^{-2}\le y<0.4$ is satisfied,
the dose amount for the deepest peak is set to be $8\times10^{12}$ $[/cm^2]$ or more.

9. The manufacturing method of the semiconductor apparatus according to claim 7, wherein
when $x=O\times((C/(1\times10^{15}))\times\exp(O/(1\times10^{17}))$, and $$y=n1/(n1+n2),$$

if x is from $1\times10^{17}[/cm^3]$ to $1\times10^{22}[/cm^3]$, and $1.129\times10^{-2}\times\ln(x)-2.660\times10^{-1}\le y<6.167\times10^{-3}\times\ln(x)+2.860\times10^{-2}$ is satisfied,
the dose amount for the deepest peak is set to be $4\times10^{12}$ $[/cm^2]$ or more, and less than $8\times10^{12}[/cm^2]$.

10. The manufacturing method of the semiconductor apparatus according to claim 7, wherein
when $x=O\times((C/(1\times10^{15}))\times\exp(O/(1\times10^{17}))$, and $$y=n1/(n1+n2),$$

if x is from $1\times10^{17}[/cm^3]$ to $1\times10^{22}[/cm^3]$, and $2.250\times10^{-2}\times\ln(x)-8.436\times10^{-1}\le y<1.129\times10^{-2}\times\ln(x)-2.660\times10^{-1}$ is satisfied,
the dose amount for the deepest peak is set to be $2\times10^{12}$ $[/cm^2]$ or more, and less than $4\times10^{12}[/cm^2]$.

11. The manufacturing method of the semiconductor apparatus according to claim 7, wherein
when $x=O\times((C/(1\times10^{15}))\times\exp(O/(1\times10^{17}))$, and $$y=n1/(n1+n2),$$

if x is from $1\times10^{17}[/cm^3]$ to $1\times10^{22}[/cm^3]$, and $3.017\times10^{-2}\times\ln(x)-1.272\le y<2.250\times10^{-2}\times\ln(x)-8.436\times10^{-1}$ is satisfied,
the dose amount for the deepest peak is set to be $5\times10^{11}$ $[/cm^2]$ or more, and less than $2\times10^{12}[/cm^2]$.

12. The manufacturing method of the semiconductor apparatus according to claim 7, wherein when
$x=O\times((C/(1\times10^{15}))\times\exp(O/(1\times10^{17}))$, and $$y=n1/(n1+n2),$$

if x is from $1\times10^{17}[/cm^3]$ to $1\times10^{22}[/cm^3]$, and $0.01\le y<3.017\times10^{-2}\times\ln(x)-1.272$ is satisfied,
the dose amount for the deepest peak is set to be less than $5\times10^{11}[/cm^2]$.

13. The manufacturing method of the semiconductor apparatus according to claim 7, wherein
when $x=O\times((C/(1\times10^{15}))\times\exp(O/(1\times10^{17}))$, and $$y=n1/(n1+n2),$$

if x is from $1\times10^{17}[/cm^3]$ to $1\times10^{22}[/cm^3]$, and:
if $y\ge6.167\times10^{-3}\times\ln(x)+2.860\times10^{-2}$ is satisfied,
the dose amount for the deepest peak is set to be $8\times10^{12}$ $[/cm^2]$ or more;
if $1.129\times10^{-2}\times\ln(x)-2.660\times10^{-1}\le y<6.167\times10^{-3}\times\ln(x)+2.860\times10^{-2}$ is satisfied,
the dose amount for the deepest peak is set to be $4\times10^{12}$ $[/cm^2]$ or more, and less than $8\times10^{12}[/cm^2]$;
if $2.250\times10^{-2}\times\ln(x)-8.436\times10^{-1}\le y<1.129\times10^{-2}\times\ln(x)-2.660\times10^{-1}$ is satisfied,
the dose amount for the deepest peak is set to be $2\times10^{12}$ $[/cm^2]$ or more, and less than $4\times10^{12}[/cm^2]$;
if $3.017\times10^{-2}\times\ln(x)-1.272\le y<2.250\times10^{-2}\times\ln(x)-8.436\times10^{-1}$ is satisfied,
the dose amount for the deepest peak is set to be $5\times10^{11}$ $[/cm^2]$ or more, and less than $2\times10^{12}[/cm^2]$; and
if $0.01\le y<3.017\times10^{-2}\times\ln(x)-1.272$ is satisfied,
the dose amount for the deepest peak is set to be less than $5\times10^{11}[/cm^2]$.

14. The manufacturing method of the semiconductor apparatus according to claim 1, wherein a value obtained by dividing the dose amount of the hydrogen ions for the deepest peak by an integral concentration of hydrogen chemical concentrations at the deepest peak is from one to three.

15. The manufacturing method of the semiconductor apparatus according to claim 2, wherein:
the plurality of concentration peaks includes a second shallow peak that is second closest from the lower surface of the semiconductor substrate, and a second deep peak that is second farthest from the lower surface of the semiconductor substrate; and
in the setting, the dose amount for the deepest peak is set based further on an integral value n2 of the carrier concentrations from the second shallow peak to the second deep peak.

16. The manufacturing method of the semiconductor apparatus according to claim 3, wherein:
the plurality of concentration peaks includes a second shallow peak that is second closest from the lower surface of the semiconductor substrate, and a second deep peak that is second farthest from the lower surface of the semiconductor substrate; and
in the setting, the dose amount for the deepest peak is set based further on an integral value n2 of the carrier concentrations from the second shallow peak to the second deep peak.

17. A semiconductor apparatus, comprising:
a semiconductor substrate having an upper surface and a lower surface;
a drift region of a first conductivity type provided in the semiconductor substrate; and a buffer region of a first conductivity type which is provided between the drift region and the lower surface of the semiconductor substrate, and includes a plurality of concentration peaks of which carrier concentrations are higher than that of the drift region, wherein the plurality of concentration peaks includes a second shallow peak that is second closest from the lower surface of the semiconductor substrate, a deepest peak that is farthest from the lower surface of the semiconductor substrate, and a second deep peak that is second farthest from the lower surface of the semiconductor substrate, and when n1 is an integral value of the carrier concentrations of the buffer region on a side upper than the second deep peak, n2 is an integral value of the carrier concentrations from the second shallow peak to the second deep peak, C is a carbon concentration of the semiconductor substrate, O is an oxygen concentration of the semiconductor substrate, and when $x=O\times((C/(1\times10^{15}))\times\exp(O/(1\times10^{17}))$, and $$y=n1/(n1+n2),$$

if x is from $1\times10^{17}[/cm^3]$ to $1\times10^{22}[/cm^3]$ and:

if $6.167\times10^{-3}\times\ln(x)+2.860\times10^{-2}\leq y<0.4$ is satisfied, an integral concentration of hydrogen concentrations of the buffer region on a side upper than the second deep peak is $8\times10^{12}[/cm^2]$ or more;

if $1.129\times10^{-2}\times\ln(x)-2.660\times10^{-1}\leq y<6.167\times10^{-3}\times\ln(x)+2.860\times10^{-2}$ is satisfied, the integral concentration of the hydrogen concentrations is $4\times10^{12}[/cm^2]$ or more, and less than $8\times10^{12}[/cm^2]$;

if $2.250\times10^{-2}\times\ln(x)-8.436\times10^{-1}\leq y<1.129\times10^{-2}\times\ln(x)-2.660\times10^{-1}$ is satisfied, the integral concentration of the hydrogen concentrations is $2\times10^{12}[/cm^2]$ or more, and less than $4\times10^{12}[/cm^2]$;

if $3.017\times10^{-2}\times\ln(x)-1.272\leq y<2.250\times10^{-2}\times\ln(x)-8.436\times10^{-1}$ is satisfied, the integral concentration of the hydrogen concentrations is $5\times10^{11}[/cm^2]$ or more, and less than $2\times10^{12}[/cm^2]$; and if $0.01\leq y<3.017\times10^{-2}\times\ln(x)-1.272$ is satisfied, the integral concentration of the hydrogen concentrations is less than $5\times10^{11}[/cm^2]$.

* * * * *